US012701882B2

(12) United States Patent     (10) Patent No.:   US 12,701,882 B2

Yang                          (45) Date of Patent:       Aug. 4, 2026

(54) DISPLAY PANEL AND DISPLAY DEVICE

(71) Applicant: WUHAN TIANMA MICRO-ELECTRONICS CO., LTD., Wuhan (CN)

(72) Inventor: Yuehua Yang, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 687 days.

(21) Appl. No.: 18/148,857

(22) Filed: Dec. 30, 2022

(65) Prior Publication Data

US 2023/0134347 A1      May 4, 2023

(30) Foreign Application Priority Data

Sep. 6, 2022    (CN) .......................... 202211086332.7

(51) Int. Cl.
     *H10K 59/179*        (2023.01)
     *H10K 59/121*        (2023.01)
     *H10K 59/88*         (2023.01)

(52) U.S. Cl.
     CPC ....... *H10K 59/179* (2023.02); *H10K 59/1213* (2023.02); *H10K 59/88* (2023.02)

(58) Field of Classification Search
     CPC .. H10K 59/179; H10K 59/1213; H10K 59/88; H10K 59/121; H10K 59/131
     See application file for complete search history.

(56) References Cited

U.S. PATENT DOCUMENTS

2020/0064702 A1*   2/2020   Yeh .................... G02F 1/136286
2020/0212115 A1*   7/2020   Choi .................... H10K 59/124

(Continued)

FOREIGN PATENT DOCUMENTS

CN      110610667 A    12/2019
CN      110851010 A     2/2020

(Continued)

OTHER PUBLICATIONS

Translation for CN-111834425-A by Lu et al. (Year: 2020).*

(Continued)

*Primary Examiner* — Jacob Y Choi
*Assistant Examiner* — Ashley Nicole Blackwell
(74) *Attorney, Agent, or Firm* — CHRISTENSEN O'CONNOR JOHNSON KINDNESS PLLC

(57)                 ABSTRACT

A display panel and a display device, including a display region, a first light-transmission hole including a first light-transmission sub-hole and a second light-transmission sub-hole, a first non-display region, a second non-display region between the first and second light-transmission sub-holes, signal lines located in the display region, arranged in a first direction and each extending in a second direction, and connection lines. The connection line electrically connects two segments of the signal line located at two sides of the first light-transmission hole. The connection lines include first-type connection lines and second-type connection lines. The first-type connection line has at least one part located between the first and second light-transmission sub-holes. The second-type connection line has at least one part located between the first light-transmission sub-hole and the first non-display region. A distance between two adjacent first-type connection lines is smaller than a distance between two adjacent second-type connection lines.

35 Claims, 15 Drawing Sheets

(56) References Cited

U.S. PATENT DOCUMENTS

| | | | |
|---|---|---|---|
| 2021/0125546 A1* | 4/2021 | Fei ........................... | G09G 3/20 |
| 2021/0303040 A1* | 9/2021 | Choi ..................... | G06F 1/1637 |
| 2021/0320163 A1* | 10/2021 | Bang ................... | H10K 59/131 |

FOREIGN PATENT DOCUMENTS

| | | | | |
|---|---|---|---|---|
| CN | 111261043 A | | 6/2020 | |
| CN | 111834425 A | * | 10/2020 | ........... H10K 59/131 |
| CN | 113160743 A | | 7/2021 | |
| CN | 113471252 A | | 10/2021 | |

OTHER PUBLICATIONS

Office Action mailed May 7, 2025; issued in corresponding Chinese
Application No. 202211086332.7; filed Sep. 6, 2022, 29 pages.

* cited by examiner

B     212          212     B'

212

DISPLAY PANEL AND DISPLAY DEVICE

CROSS-REFERENCE TO RELATED APPLICATIONS

The present application claims priority to Chinese Patent Application No. 202211086332.7, filed on Sep. 6, 2022, the content of which is incorporated herein by reference in its entirety.

TECHNICAL FIELD

The present disclosure relates to the field of display technologies, and in particular, to a display panel and a display device.

BACKGROUND

For current display panels to achieve a full-screen design, a light-transmission hole is provided at a position in a display region corresponding to a camera arranging position. Since some signal lines may be disconnected by the light-transmission hole provided in the display area, how to ensure a normal driving of sub-pixels arranged corresponding to the light-transmission hole has become the focus of the researchers.

SUMMARY

In view of this, various embodiments of the present disclosure provide a display panel including a light-transmission hole and a display device including the display panel.

In one aspect, some embodiments of the present disclosure provide a display panel. The display panel may include a display region; a first non-display region at least partially surrounding the display region; a first light-transmission hole, the first light-transmission hole including a first light-transmission sub-hole and a second light-transmission sub-hole arranged along a first direction, and the display region at least partially surrounding the first light-transmission hole, and a second non-display region located between the first light-transmission sub-hole and the second light-transmission sub-hole. The display panel may also include signal lines arranged in the display region, the signal lines being arranged along the first direction and each extending along a second direction, and connection lines, each of the connection lines electrically connecting two segments of a respective one of the signal lines located at two sides of the first light-transmission hole. The connection lines may include first-type connection lines and second-type connection lines, each of the first-type connection lines has at least one part located between the first light-transmission sub-hole and the second light-transmission sub-hole, and each of the second-type connection lines has at least one part located between the first light-transmission sub-hole and the first non-display region. A distance between two adjacent first-type connection lines of the first-type connection lines may be smaller than a distance between two adjacent second-type connection lines of the second-type connection lines.

In another aspect, some embodiments of the present disclosure provide a display device including the display panel described above.

The display panel and display device provided by embodiments of the present disclosure each include the first-type connection lines and the second-type connection lines. Two segments of the first signal line that are disconnected by the first light-transmission hole are connected by the first-type connection line or the second-type connection line, so that a signal transmission path is conductive/connected.

Furthermore, in embodiments of the present disclosure, the first-type connection line is arranged in the region between the first light-transmission sub-hole and the second light-transmission sub-hole, and the region between the first light-transmission sub-hole and the second light-transmission sub-hole is the second non-display region that is not used for image displaying, so the second non-display region is utilized more reasonably.

Furthermore, one side of the first light-transmission sub-hole close to the second light-transmission sub-hole and one side of the second light-transmission sub-hole close to the first light-transmission sub-hole are provided with a larger number of connection lines for electrically connecting the first signal line that is disconnected by the first light-transmission sub-hole, the second light-transmission sub-hole, or the second non-display region. In embodiments of the present disclosure, the distance between two adjacent first-type connection lines is smaller than the distance between two adjacent second-type connection lines. As a result, the mutual interference between the first-type connection lines located between the first light-transmission sub-hole and the second light-transmission sub-hole is reduced, which is beneficial to reducing the signal crosstalk between the first-type connection lines located between the first light-transmission sub-hole and the second light-transmission sub-hole.

BRIEF DESCRIPTION OF DRAWINGS

In order to better illustrate technical solutions in the embodiments of the present disclosure, the accompanying drawings used in the embodiments are briefly introduced as follows. It should be noted that the drawings described as follows are merely part of the embodiments of the present disclosure, and other drawings can also be acquired by those skilled in the art.

DESCRIPTION OF EMBODIMENTS

For better illustrating technical solutions of the present disclosure, embodiments of the present disclosure will be described in detail as follows with reference to the accompanying drawings.

It should be noted that the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there can be three relationships, for example, A and/or B can indicate that three cases, i.e., A alone, A and B, B alone. In addition, the character "/" herein generally indicates that the related objects before and after the character are in an "or" relationship.

It should be understood that although the layer can be described using the terms of "first", "second", etc., in the embodiments of the present disclosure, the layer will not be limited to these terms. These terms are merely used to distinguish light-transmission holes from one another. For example, without departing from the scope of the embodiments of the present disclosure, a first light-transmission hole can also be referred to as a second light-transmission hole, similarly, a second light-transmission hole can also be referred to as a first light-transmission hole.

Figure 1:
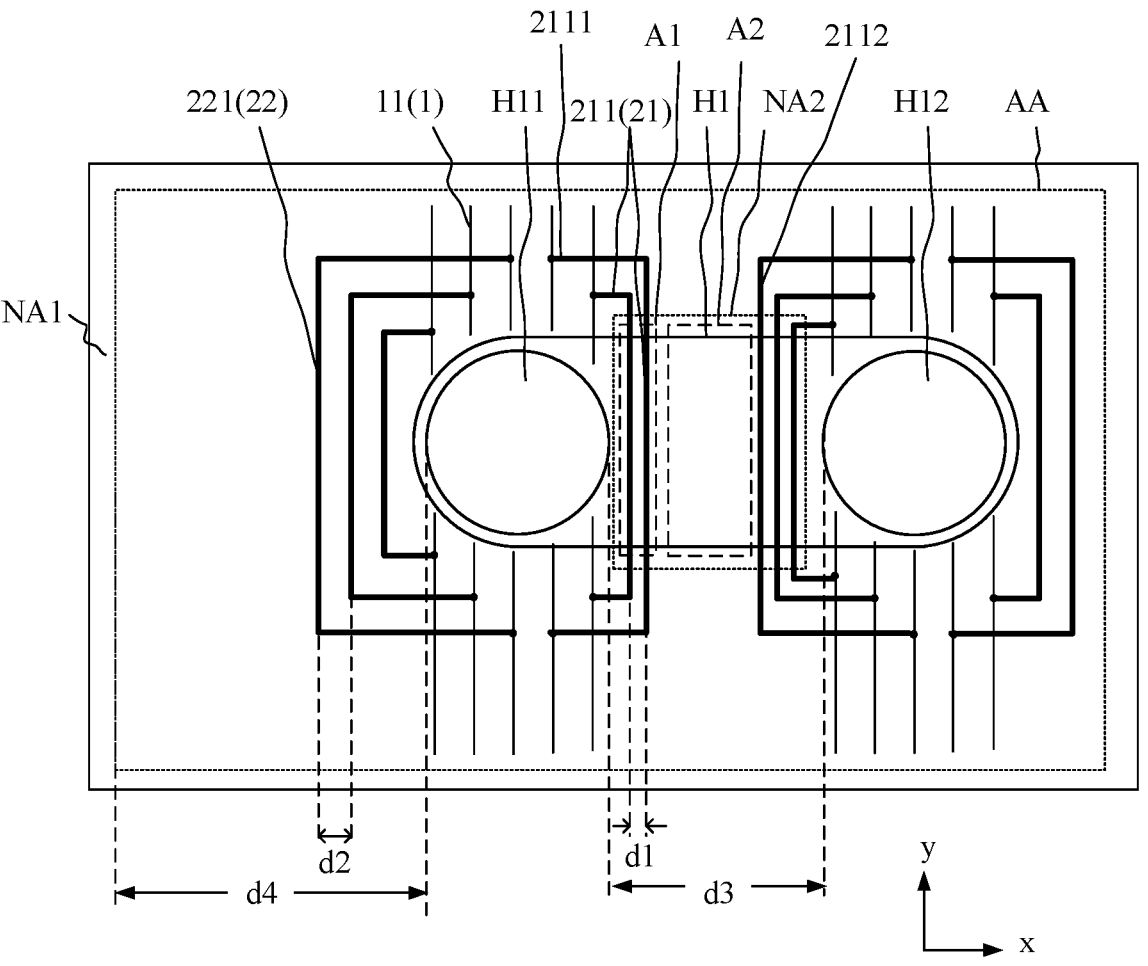
FIG. 1 is a schematic diagram of a display panel according to some embodiments of the present disclosure.

Some embodiments of the present disclosure provide a display panel. FIG. 1 is a schematic diagram of a display panel according to some embodiments of the present disclosure. As shown in FIG. 1, the display panel has a display region AA, a first non-display region NA1, and a first light-transmission hole H1. The display panel includes sub-pixels (not shown) located in the display region AA. Exemplarily, the sub-pixel includes a pixel driving circuit and a light-emitting element that are electrically to each other. The light-emitting element includes at least one of an organic light-emitting diode, a micro light-emitting diode, or a quantum dot light-emitting diode.

As shown in FIG. 1, the first light-transmission hole H1 includes a first light-transmission sub-hole H11 and a second light-transmission sub-hole H12 arranged in a first direction x. The display region AA at least partially surrounds the first light-transmission hole H1. The first light-transmission sub-hole H11 and the second light-transmission sub-hole H12 may be fused or arranged optical components, such as a camera. In some embodiments of the present disclosure, the first light-transmission sub-hole H11 and the second light-transmission sub-hole H12 may be blind holes that do not run though the display panel in a thickness direction of the display panel or may be through-holes that run though the display panel in the thickness direction of the display panel. In some embodiments of the present disclosure, the shape of the first light-transmission sub-hole H11 and the shape of the second light-transmission sub-hole H12 may be the same. In some embodiments of the present disclosure, the shape of the first light-transmission sub-hole H11 and the shape of the second light-transmission sub-hole H12 may be different. In some embodiments of the present disclosure, the area of the first light-transmission sub-hole H11 and the area of the second light-transmission sub-hole H12 may be the same. In some embodiments of the present disclosure, the area of the first light-transmission sub-hole H11 and the area of the second light-transmission sub-hole H12 may be different. The present disclosure does not limit thereto.

Exemplarily, as shown in FIG. 1, the display panel further has a second non-display area NA2. Along the first direction x, the second non-display area NA2 is located between the first light-transmission sub-hole H11 and the second light-transmission sub-hole H12. That is, in embodiments of the present disclosure, no sub-pixel is arranged in the region of the first light-transmission sub-hole H11, the region of the second light-transmission sub-hole H12, and the region between the first light-transmission sub-hole H11 and the second light-transmission sub-hole H12 along the first direction x.

As shown in FIG. 1, the display panel further includes signal lines 1 that are located in the display region and arranged along the first direction x. The signal lines 1 each extend along the second direction y. Each of the signal lines 1 is electrically connected to multiple pixel driving circuits that are arranged along the second direction y, so as to drive the multiple light-emitting elements.

Exemplarily, the signal lines 1 at least includes a first signal line 11, and the first signal line 11 has two segments located at two sides of the first light-transmission hole H1 along the second direction y. That is, a virtual extension line of the first signal line 11 passes the first light-transmission hole H1.

As shown in FIG. 1, the display panel further includes: at least two first-type connection lines 21 and at least two second-type connection lines 22. The first-type connection line 21 electrically connects two segments of one first signal line 11 that are located at two sides of the first light-transmission hole H1. The second-type connection line 22 electrically connects two segments of another one first signal line 11 that are located at two sides of the first light-transmission hole H1. As shown in FIG. 1, the first-type connection line 21 has at least one part located between the first light-transmission sub-hole H11 and the second light-transmission sub-hole H12, and the second-type connection line 22 has at least one part located between the first light-transmission sub-hole H11 and the first non-display region NA1.

In some embodiments of the present disclosure, as shown in FIG. 1, among at least a part of the least two first-type connection lines 21, a distance d1 between two adjacent first-type connection lines 21 is smaller than a distance d2 between two adjacent second-type connection lines 22.

The display panel of embodiments of the present disclosure is provided with the first-type connection line 21 and the second-type connection line 22, the first signal line 11 is disconnected by the first light-transmission hole H1, and two segments of the first signal line 11 located at two sides of the first light-transmission hole H1 are electrically connected by the first-type connection line 21 or the second-type connection line 22, so that a signal transmission path is conductive/connected.

Furthermore, the first-type connection line 21 is arranged in the region between the first light-transmission sub-hole H11 and the second light-transmission sub-hole H12, and the region between the first light-transmission sub-hole H11 and the second light-transmission sub-hole H12 is the second non-display region NA2 that is not used for image displaying, so the second non-display region NA2 is utilized more reasonably.

Furthermore, one side of the first light-transmission sub-hole H11 close to the second light-transmission sub-hole H12 and one side of the second light-transmission sub-hole H12 close to the first light-transmission sub-hole H11 are provided with a larger number of connection lines for electrically connecting the first signal line 11 that is disconnected by the first light-transmission sub-hole H11, the second light-transmission sub-hole H12, or the second non-display region NA2. In embodiments of the present disclosure, the distance d1 between two adjacent first-type connection lines 21 is smaller than the distance d2 between two adjacent second-type connection lines 22. As a result, the mutual interference between the first-type connection lines 21 located between the first light-transmission sub-hole H11 and the second light-transmission sub-hole H12 is reduced, which is beneficial to reducing the signal crosstalk between the first-type connection lines 21 located between the first light-transmission sub-hole H11 and the second light-transmission sub-hole H12.

Exemplarily, as shown in FIG. 1, the at least two first-type connection lines 21 include at least one first A connection line 211, and each of the at least one first A connection line 211 has at least one part located in the display region AA. With such a configuration, the driving of the pixel driving circuits that are located in a same column and located at two sides of the first light-transmission hole H1 is realized, and the number of the connection lines arranged at a periphery of the first light-transmission sub-hole H11 or the second light-transmission sub-hole H12 is reduced, thereby being beneficial to reducing a width of a non-display region surrounding the first light-transmission sub-hole H11 or the second light-transmission sub-hole H12. FIG. 1 illustrates an example in which five first A connection lines 211 are arranged between the first light-transmission sub-hole H11 and the second light-transmission sub-hole H12, and each of the five first A connection lines 211 has a part in the display region AA.

Figure 2:
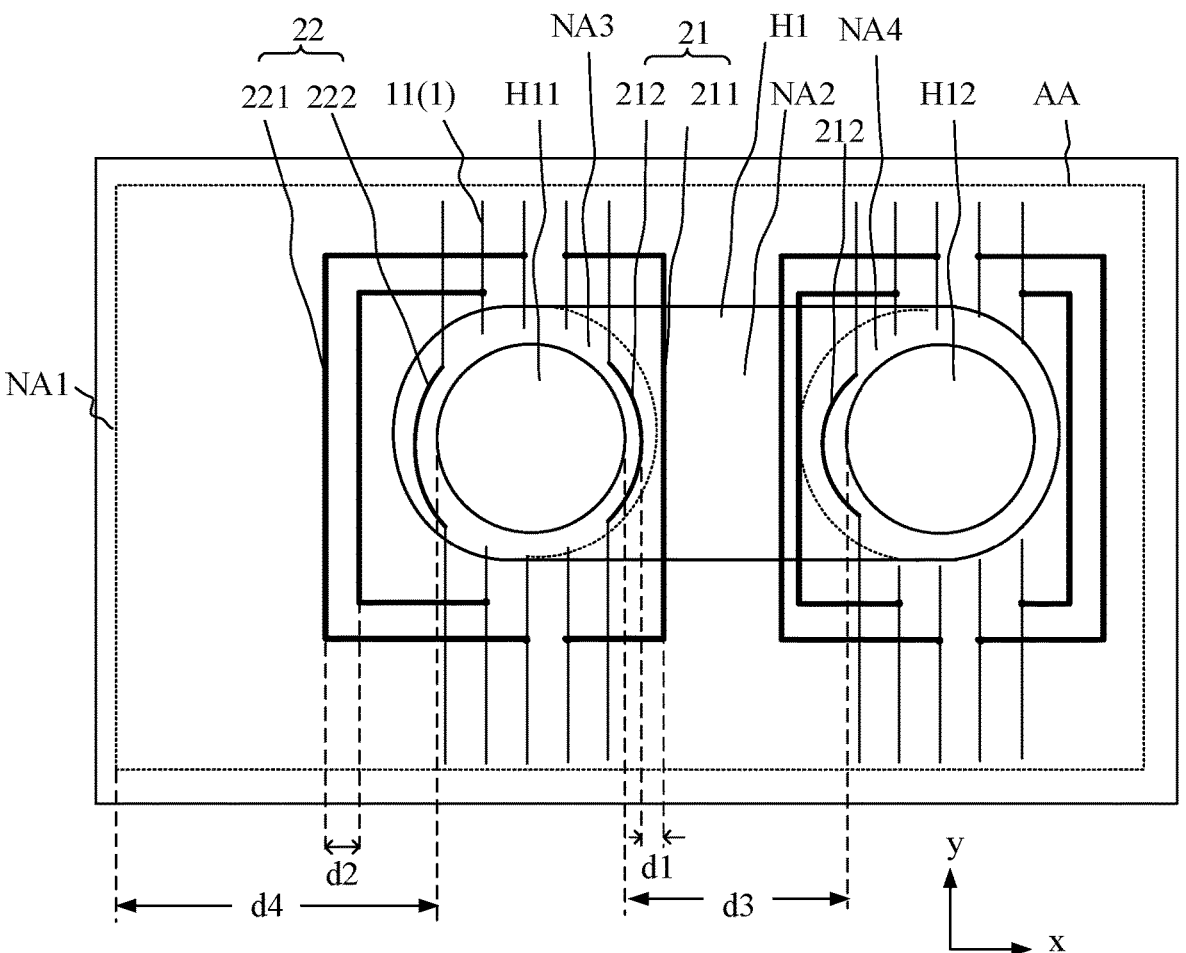
FIG. 2 is a schematic diagram of another display panel according to some embodiments of the present disclosure.

FIG. 2 is a schematic diagram of another display panel according to some embodiments of the present disclosure. In some exemplary embodiment, as shown in FIG. 2, the display panel further has a third non-display region NA3 and a fourth non-display region NA4. The display region AA at least partially surrounds the third non-display region NA3 and the fourth non-display region NA4. The third non-display region NA3 at least partially surrounds the first light-transmission sub-hole H11, and the fourth non-display region NA4 at least partially surrounds the second light-transmission sub-hole H12.

As shown in FIG. 2, the at least two first-type connection lines 21 further include at least one first B connection line 212, and the at least one first B connection line 212 is located in the third non-display region NA3 or the fourth non-display region NA4. That means, the first B connection line 212 is arranged at least partially surrounding the first light-transmission sub-hole H11, or the first B connection line 212 is arranged at least partially surrounding the second light-transmission sub-hole H12. FIG. 2 illustrates an example in which each of the third non-display region NA3 and the fourth non-display region NA4 is provided with one first B connection line 212 therein. Exemplarily, the first B connection line 212 has at least one part that extends along an edge of the first light-transmission sub-hole H11 or extends along an edge of the second light-transmission sub-hole H12. In the example shown in FIG. 2, one first B connection line 212 partially surrounds the first light-transmission sub-hole H11, and another one first B connection line partially surrounds the second light-transmission sub-hole H12. With such a configuration, at an aspect, the space of the second non-display region NA2 between the first light-transmission sub-hole H11 and the second light-transmission sub-hole H12 can be effectively utilized, thereby avoiding that the first-type connection line 21 occupies other space in the display panel; and at another aspect, a length of the first B connection line 212 does not need to be too large, thereby ensuring that the load of the first signal line 1 connected to the first B connection line 212 is consistent with the load of other signal line 1 that does not pass the first light-transmission hole H1.

Exemplarily, as shown in FIG. 1, the at least two second-type connection lines 22 include at least one second A connection line 221, and each of the at least one second A connection line 221 has at least one part located in the display region AA. With such a configuration, the driving of the pixel driving circuits that are located in a same column and located at two sides of the first light-transmission hole H1 is realized, and the number of the connection lines arranged at a periphery of the first light-transmission hole H1 is reduced, thereby being beneficial to reducing a width of a non-display region surrounding the first light-transmission sub-hole H1 and thus improving the visual effect. FIG. 1 illustrates an example in which three second A connection lines 221 are arranged between the first light-transmission sub-hole H11 and the first non-display region NA1, and the three second A connection lines 221 are all located in the display region AA.

Exemplarily, as shown in FIG. 2, the at least two second-type connection lines 22 include at least one second B connection line 222, and the at least one second B connection line 222 is located in the third non-display region NA3. That is, the second B connection line 222 partially surrounds the first light-transmission sub-hole H11. With such a configuration, a length of the second-type connection line 22 does not need to be too large, thereby ensuring that the load of the first signal line 1 connected to the second-type connection line 22 is consistent with the load of other signal line 1 that does not pass the first light-transmission hole H1.

In some exemplary embodiments, as shown in FIG. 2, the display panel includes first-type connection lines 21, one or more of the first-type connection lines 21 are configured as the first A connection lines 211, and another one or more of the first-type connection lines 21 are configured as the first B connection lines 212. That is, one or more of the first-type connection lines 21 each have at least one part located in the display region AA, and another one or more of the first-type connection lines 21 each at least partially surround the first light-transmission sub-hole H11 or the second light-transmission sub-hole H12. Similarly, in some embodiments, the display panel includes second-type connection lines 22, one or more of the second-type connection lines 22 are configured as the second A connection lines 221, and another one or more of the second-type connection lines 22 are configured as the second B connection lines 222. That is, one or more of the second-type connection lines 22 each have at least one part located in the display region AA, and another one or more of the second-type connection lines 22 each at least partially surround the first light-transmission sub-hole H11.

Figure 3:
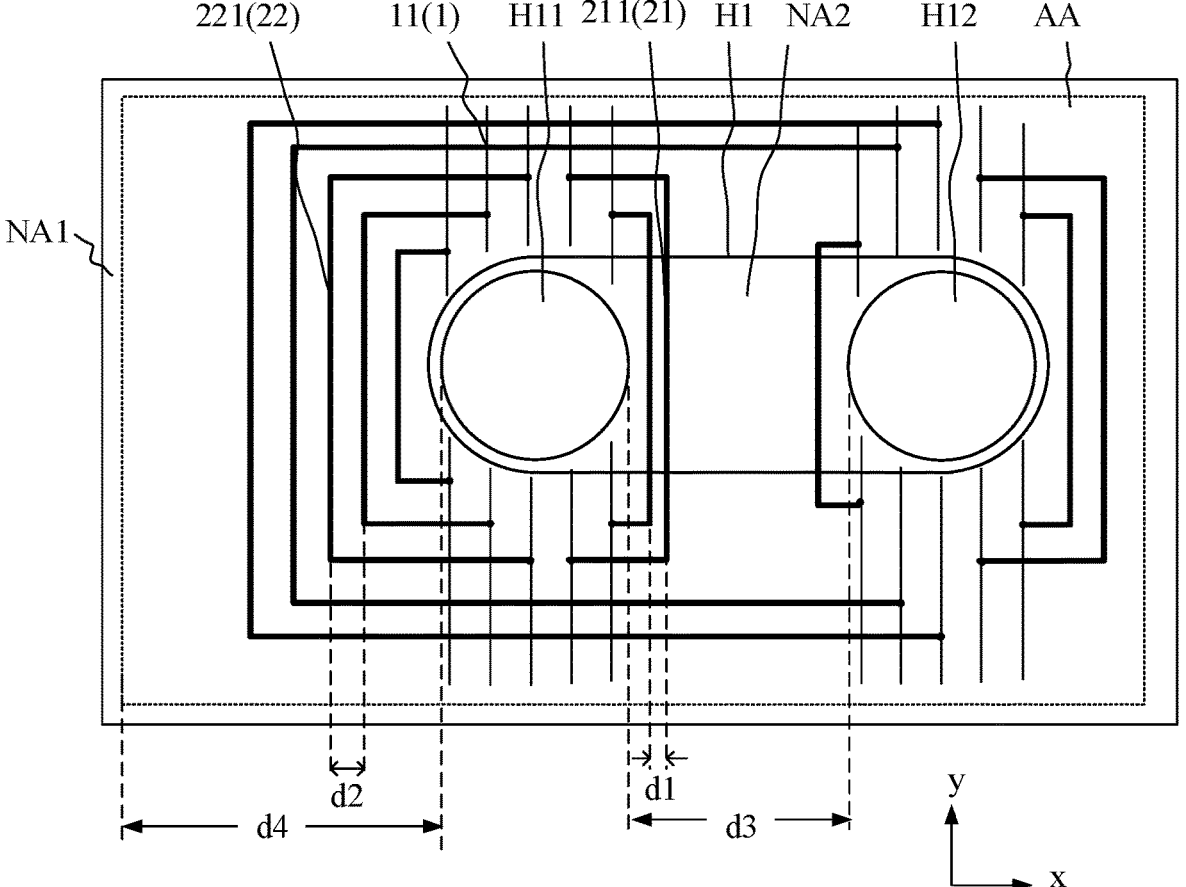
FIG. 3 is a schematic diagram of yet another display panel according to some embodiments of the present disclosure.

FIG. 3 is a schematic diagram of yet another display panel according to some embodiments of the present disclosure. In some exemplary embodiments of the present disclosure, the number of the first-type connection lines 21 is less than the number of the second-type connection lines 22. With such a configuration, the light transmittance of the region between the first light-transmission sub-hole H11 and the second light-transmission sub-hole H12 is increased. In the display device including the display panel, optical elements can be arranged in the region between the first light-transmission sub-hole H11 and the second light-transmission sub-hole H12, thereby enriching the functions of the display panel and improving the user experience.

Figure 4:
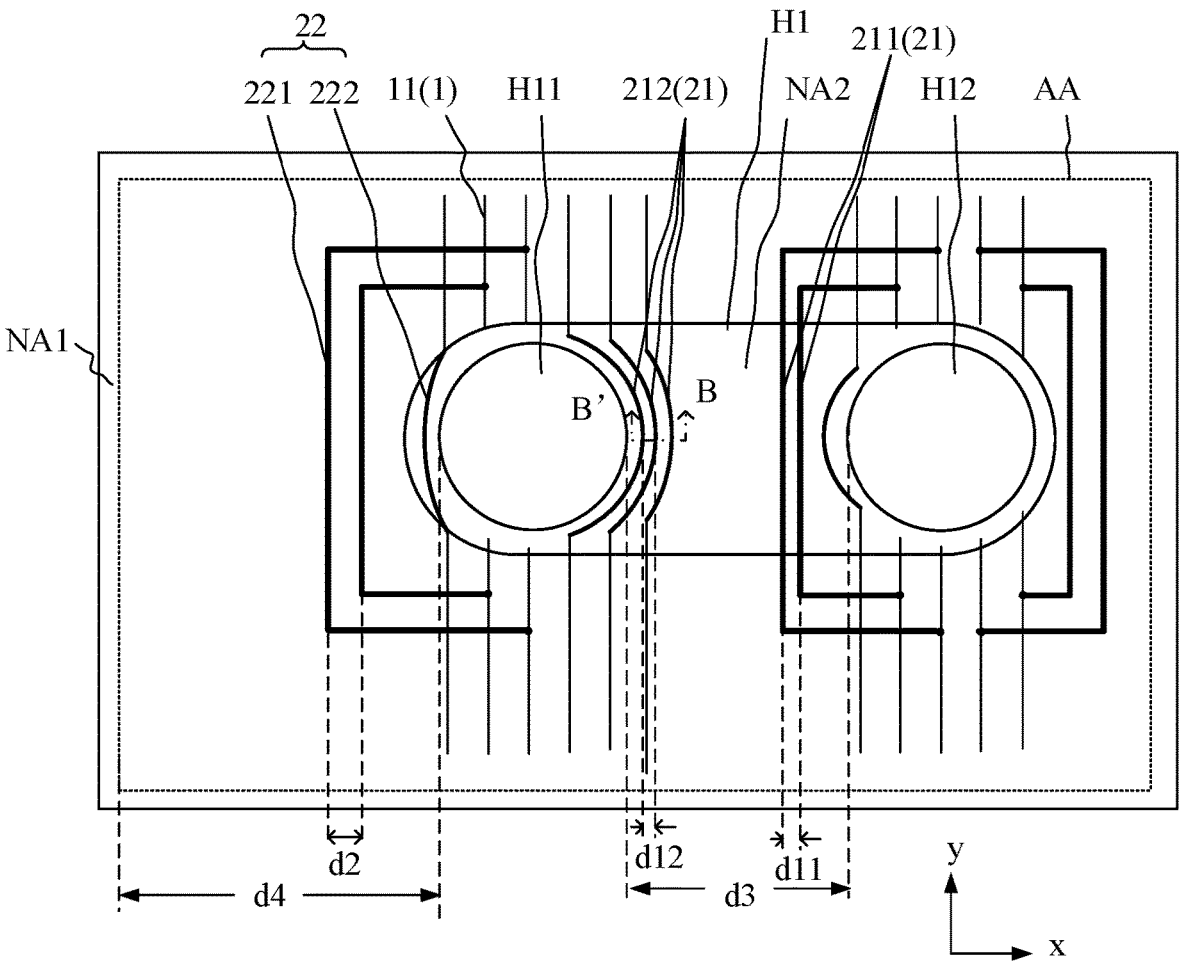
FIG. 4 is a schematic diagram of yet another display panel according to some embodiments of the present disclosure.

FIG. 4 is a schematic diagram of yet another display panel according to some embodiments of the present disclosure. Exemplarily, as shown in FIG. 4, the first-type connection lines 21 include at least two first A connection lines 211 and at least two first B connection lines 212. The first A connection line 211 includes at least one part located in the display region AA. The first B connection line 212 at least partially surrounds the first light-transmission sub-hole H11. In some embodiments, at least one first-type connection line 21 has at least one part surrounds the second light-transmission sub-hole H12. In some embodiments of the present disclosure, a distance d11 of two adjacent first A connection lines 211 is greater than or equal to a distance d12 of two adjacent first B connection lines 212. With such a configuration, the space for arranging the first B connection lines 212 is reduced, thereby avoiding that a width of the non-display region surrounding the first light-transmission sub-hole H11 or the second light-transmission sub-hole H12 is too large.

Figure 5:
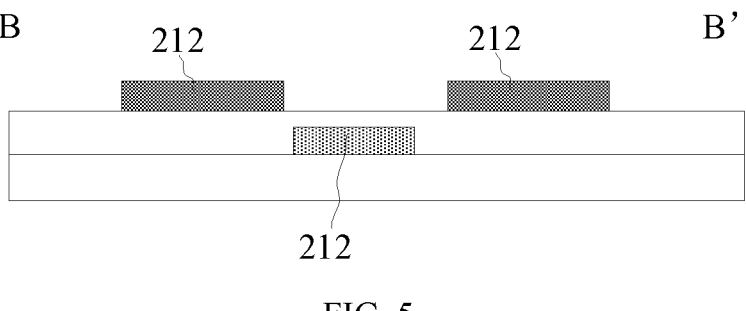
FIG. 5 is a schematic cross-sectional view taken along BB' shown in FIG. 4.

FIG. 5 is a schematic cross-sectional view taken along BB' shown in FIG. 4. In some embodiments in which the first-type connection lines 21 includes at least two first B connection lines 212, as shown in FIG. 5, two adjacent first B connection lines 212 are located in different layers. Such an arrangement can further reduce a distance between two adjacent first B connection lines 212, which is beneficial to narrowing the width of the space occupied by the at least two first B connection lines 212. Accordingly, more first-type connection lines 21 can be arranged in the limited region between the first light-transmission sub-hole H11 and the second light-transmission sub-hole H12. In some embodiments, in a direction perpendicular to a plane of the display panel, at least one first B connection line 212 overlaps at least one first A connection line 211.

Figure 6:
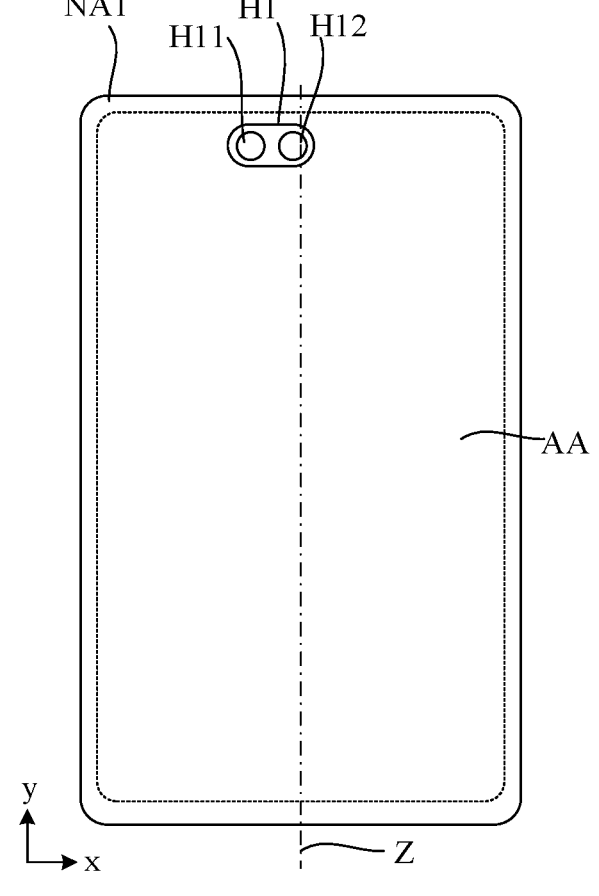
FIG. 6 is a schematic diagram of yet another display panel according to some embodiments of the present disclosure.

FIG. 6 is a schematic diagram of yet another display panel according to some embodiments of the present disclosure. Exemplarily, as shown in FIG. 6, the display region AA has a symmetry axis Z extending along the second direction y, and the symmetry axis Z passes the first light-transmission hole H1. In an exemplary embodiment, the symmetry axis Z overlaps the first light-transmission sub-hole H11 or the symmetry axis Z overlaps the second light-transmission sub-hole H12. In an example as shown in FIG. 6, the symmetry axis Z overlaps the second light-transmission sub-hole H12. With such a configuration, the region that is surrounded by the display region AA and does not display images is arranged at a position close to a central axis of the display panel, thereby improving the symmetry of the display region AA, and thus improving the overall display effect in a visual aspect.

Exemplarily, as shown in FIG. 1, FIG. 2, FIG. 3 and FIG. 4, along the first direction x, a distance d3 between the first light-transmission sub-hole H11 and the second light-transmission sub-hole H12 is not equal to a distance d4 between the first light-transmission sub-hole H11 and the first non-display region NAL In some embodiments, d3 is greater than d4, so that more first-type connection lines 21 may be arranged between the first light-transmission sub-hole H11 and the second light-transmission sub-hole H12. As a result, less second-type connection lines 22 are arranged between the first light-transmission sub-hole H11 and the first non-display region NA1, and the crosstalk between the second-type connection lines 22 and other wires in the display region AA is reduced.

Figure 7:
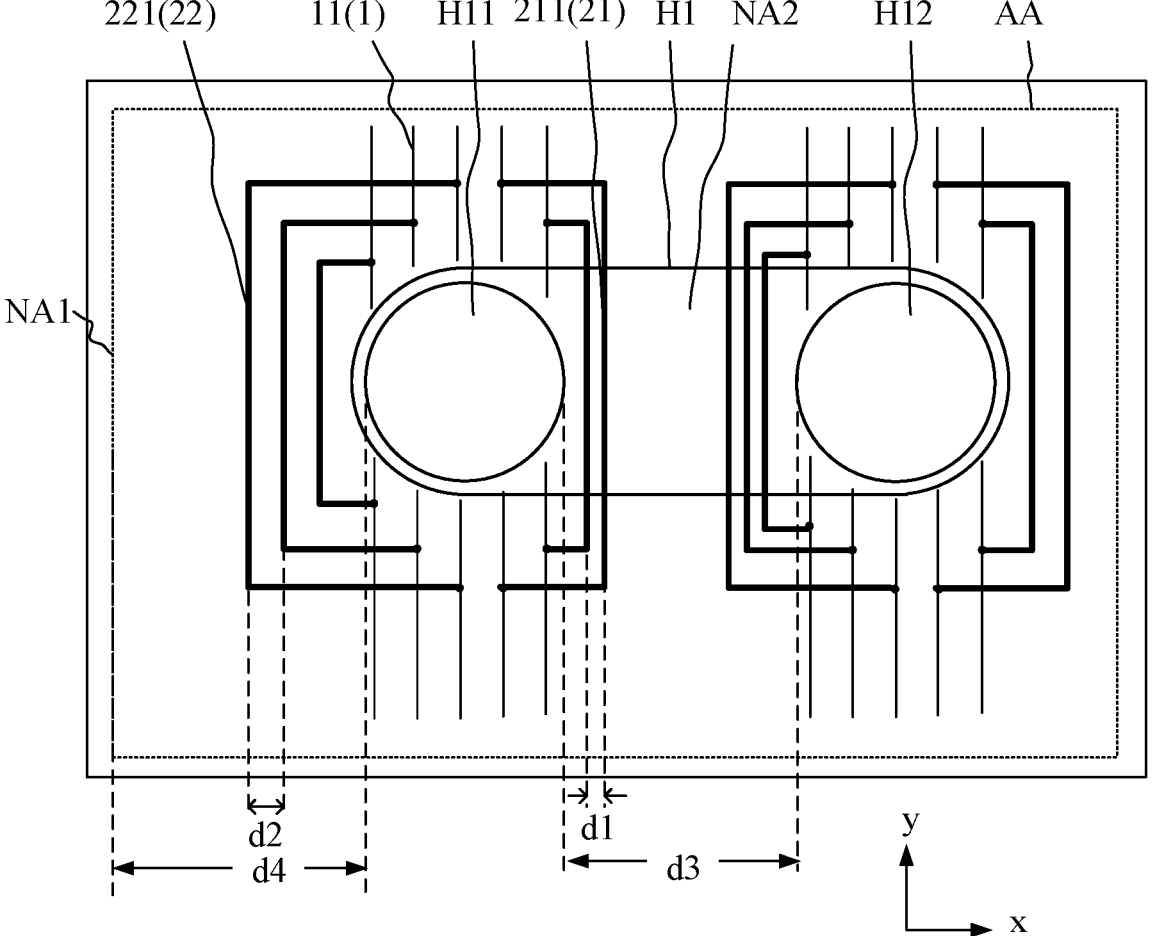
FIG. 7 is a schematic diagram of yet another display panel according to some embodiments of the present disclosure.

FIG. 7 is a schematic diagram of yet another display panel according to some embodiments of the present disclosure. In an embodiment, as shown in FIG. 7, d3 is smaller than d4, so that the light-transmission sub-hole H11 and the second light-transmission sub-hole H12 may be arranged in a more compact manner, which is beneficial to improving the visual effect of the display panel.

Figure 8:
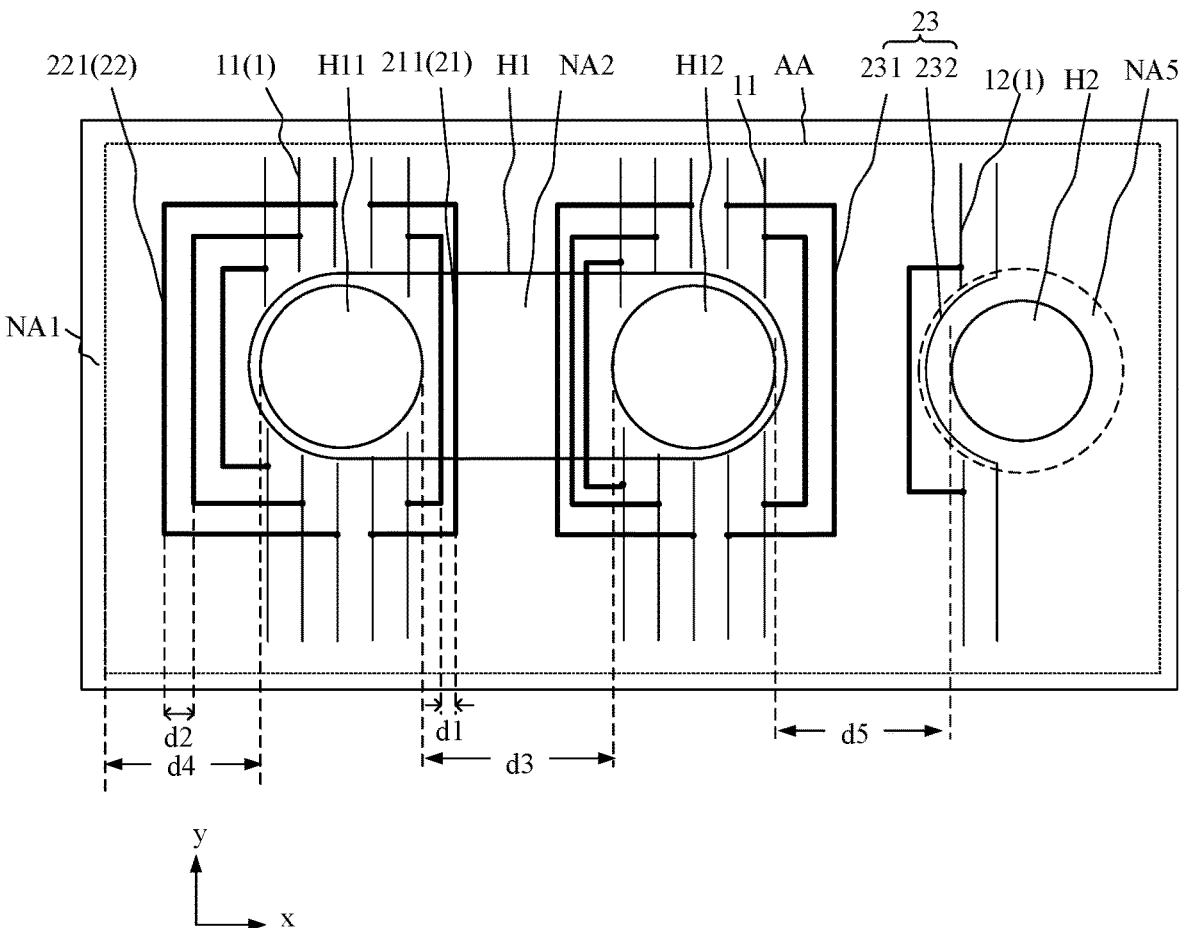
FIG. 8 is a schematic diagram of yet another display panel according to some embodiments of the present disclosure.
Figure 9:
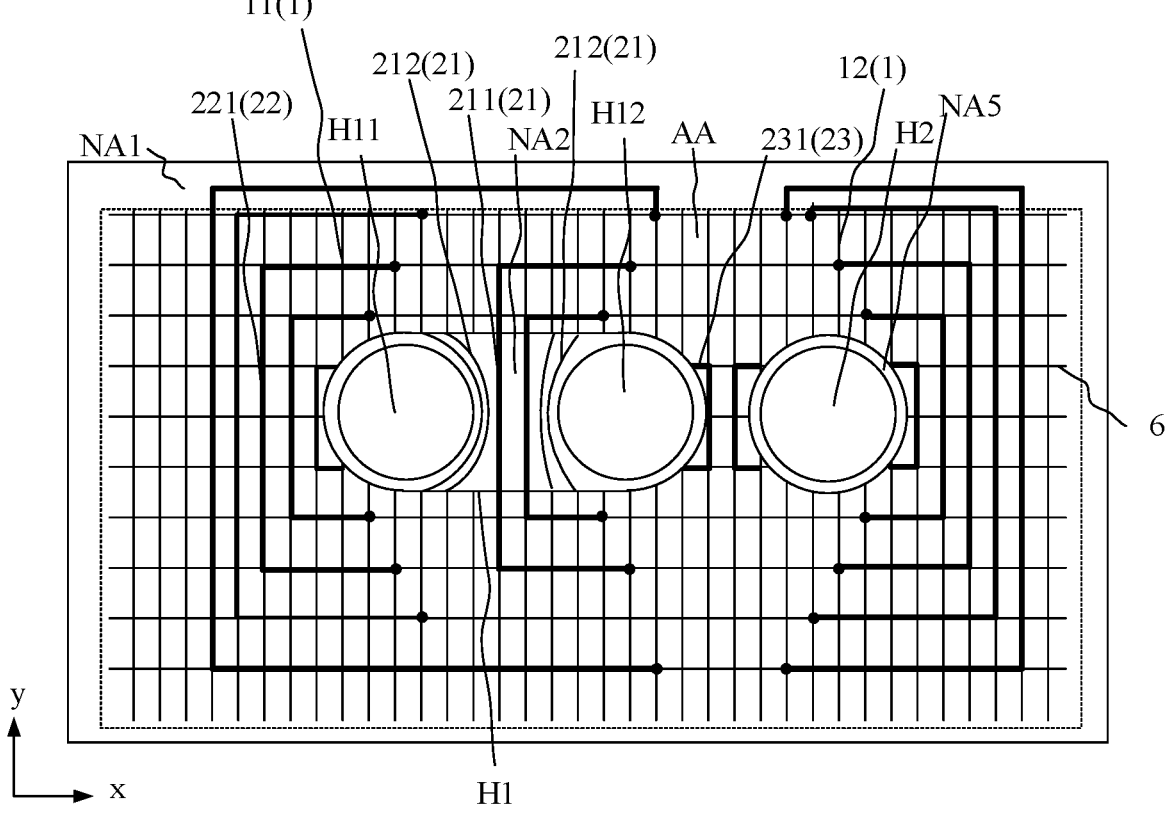
FIG. 9 is a schematic diagram of yet another display panel according to some embodiments of the present disclosure.

FIG. 8 and FIG. 9 are schematic diagrams of yet another two display panels according to some embodiments of the present disclosure. In some exemplary embodiments of the present disclosure, as shown in FIG. 8 and FIG. 9, the display panel further includes a second light-transmission hole H2. Along the first direction x, the second light-transmission hole H2 is located at a side of the second light-transmission sub-hole H12 away from the first light-transmission sub-hole H11. Exemplarily, along the first direction x, a length of the second light-transmission hole H2 may be smaller than that of the first light-transmission hole H1.

As shown in FIG. 8 and FIG. 9, the display panel further includes at least one third-type connection line 23. The third-type connection line 23 has at least one part located between the first light-transmission hole H1 and the second light-transmission hole H2. In some embodiments of the present disclosure, the third-type connection line 23 may be configured to connect two segments of the first signal line 11 that are located at two sides of the first light-transmission hole H1. Alternatively, the signal lines 1 further include at least one second signal line 12. Along the second direction y, each second signal line 12 has two segments that are located at two sides of the second light-transmission hole H2. In some embodiments, one or more of the at least one third-type connection line 23 may be configured to connect the two segments of the second signal line 12.

Exemplarily, as shown in FIG. 8, the distance d3 between the first light-transmission sub-hole H11 and the second light-transmission sub-hole H12 is greater than a distance d5 between the second light-transmission sub-hole H12 and the second light-transmission hole H2. In some embodiments of the present disclosure, an optical element such as a camera may be arranged between the first light-transmission sub-hole H11 and the second light-transmission sub-hole H12.

When designing the distance between the first light-transmission sub-hole H11 and the second light-transmission sub-hole H12 and the distance between the second light-transmission sub-hole H12 and the second light-transmission hole H2, the distance between the first light-transmission sub-hole H11 and the second light-transmission sub-hole H12 is larger in some embodiments of the present disclosure, so that more optical elements may be arranged between the first light-transmission sub-hole H11 and the second light-transmission sub-hole H12, thereby being beneficial to improving the non-display performance of the display panel, such as photographing.

Exemplarily, the region between the first light-transmission hole H1 and the second light-transmission hole H2 belongs to the display region AA and is provided with sub-pixels (not shown).

Exemplarily, as shown in FIG. 8 and FIG. 9, the third-type connection lines 23 include at least one third A connection line 231. The third A connection line 231 has at least one part located in the display region AA. The third A connection line 231 is configured to connect two segments of the first signal line 11 that are located at two sides of the first light-transmission hole H1; or the third A connection line 231 is configured to connect two segments of the second signal line 12 that are located at two sides of the second light-transmission hole H2. Such arrangement can reduce the number of the connection lines arranged at a periphery of the first light-transmission hole H1 or at a periphery of the second light-transmission hole H2, thereby being beneficial to reducing the width of the non-display region surrounding the first light-transmission hole H1 or the second light-transmission hole H12.

In some embodiments, as shown in FIG. 8, the third-type connection lines 23 include at least one third B connection line 232, and the at least one third B connection line 232 is located in the fifth non-display region NA5. The fifth non-display region NA5 at least partially surrounds the second light-transmission hole H2. Exemplarily, the third-type connection line 23 has at least one part that may extend along an edge of the second light-transmission hole H2. Such arrangement can avoid that a length of the third B connection line 232 is too large and ensure that the load of the signal line 1 connected to the third B connection line 232 is consistent with the load of other signal line 1 that does not pass the first light-transmission hole H1 or the second light-transmission hole H2.

Exemplarily, as shown in FIG. 8, the width of the fifth non-display region NA5 is greater than that of the third non-display region NA3 or that of the fourth non-display region NA4. Accordingly, in some embodiments, an aperture diameter of the second light-transmission hole H2 is smaller than an aperture diameter of the third non-display region NA3 or an aperture diameter of the fourth non-display region NA4. With such a configuration, more third B connection lines 232 may be arranged in the fifth non-display region NA5, thereby being beneficial to reducing the length of the third-type connection line 23. As a result, the load of the second signal line 12 that is electrically connected to the third-type connection line 23 is consistent with the load of other signal line 1 that does not pass the second light-transmission hole H2.

Exemplarily, as shown in FIG. 9, the display panel further includes another type of signal line 6 extending along the first direction x. In some embodiments of the present disclosure, the signal line 1 extending along the second direction y includes a data line, and the signal line 6 extending along the first direction x includes a scan line.

Exemplarily, as shown in FIG. 1, the first A connection line 211 includes a first connection sub-line 2111 and a second connection sub-line 2112, and an extending direction of the first connection sub-line 2111 intersects an extending direction of the second connection sub-line 2112. Exemplarily, as shown in FIG. 1, the first connection sub-line 2111 extends along the first direction x, and the second sub-line 2112 extends along the second direction y.

Exemplarily, in some embodiments, the first connection sub-line 2111 and the second connection sub-line 2112 are arranged in a same layer, so as to simplify the manufacturing process. Alternatively, each of the first connection sub-line 2111 and the second connection sub-line 2112 may be arranged in a layer different from the layer of the signal line 1, and the signal line 1 is electrically connected to the first connection sub-line 2111 or the second connection sub-line 2112 via a through-hole.

Alternatively, in some embodiments, the first connection sub-line 2111 and the second connection sub-line 2112 are located in different layers and are electrically connected via a through-hole.

Exemplarily, in some embodiments, one of the first connection sub-line 2111 and the second connection sub-line 2112 is located in the first non-display region NA1.

Figure 10:
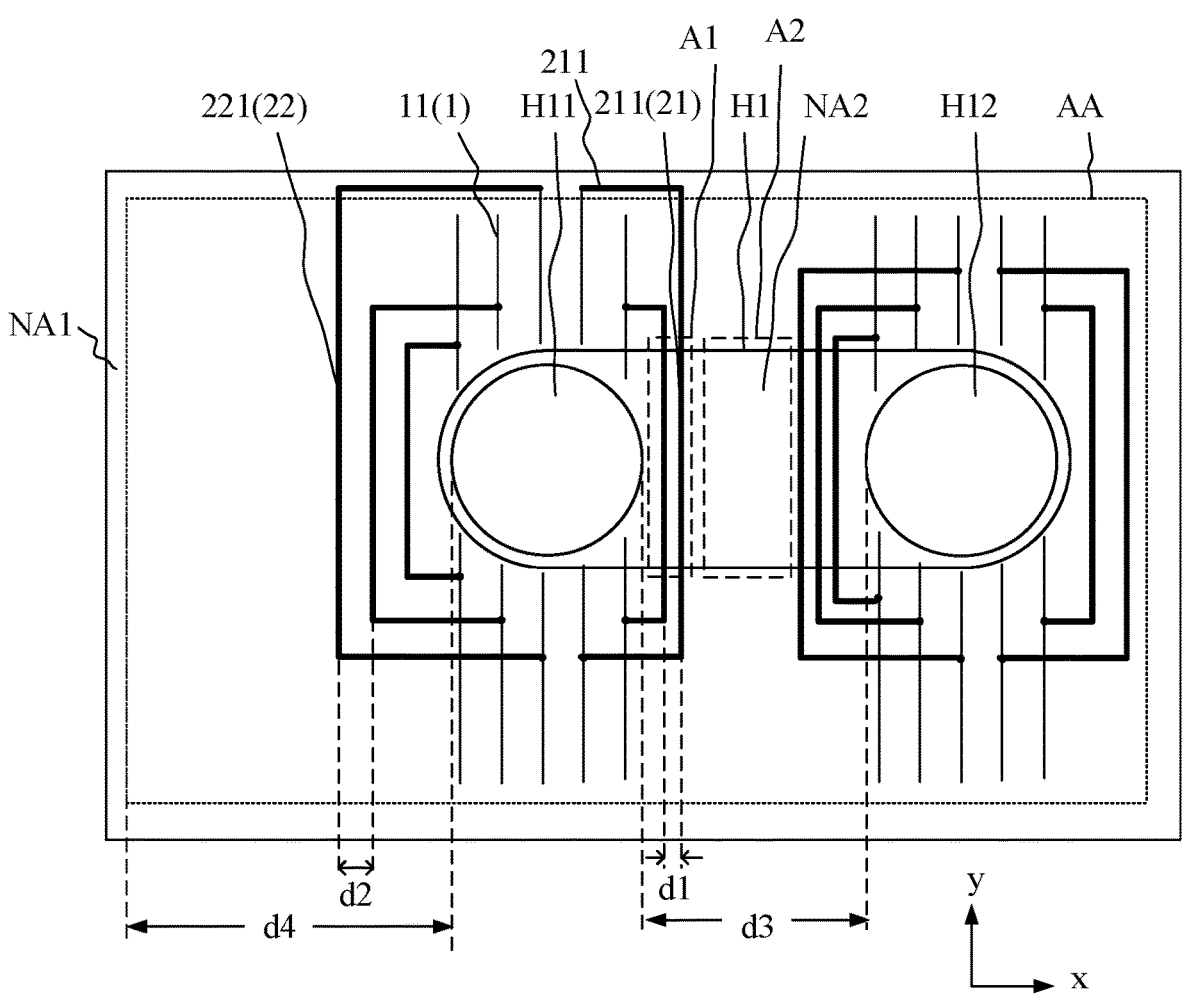
FIG. 10 is a schematic diagram of yet another display panel according to some embodiments of the present disclosure.
Figure 11:
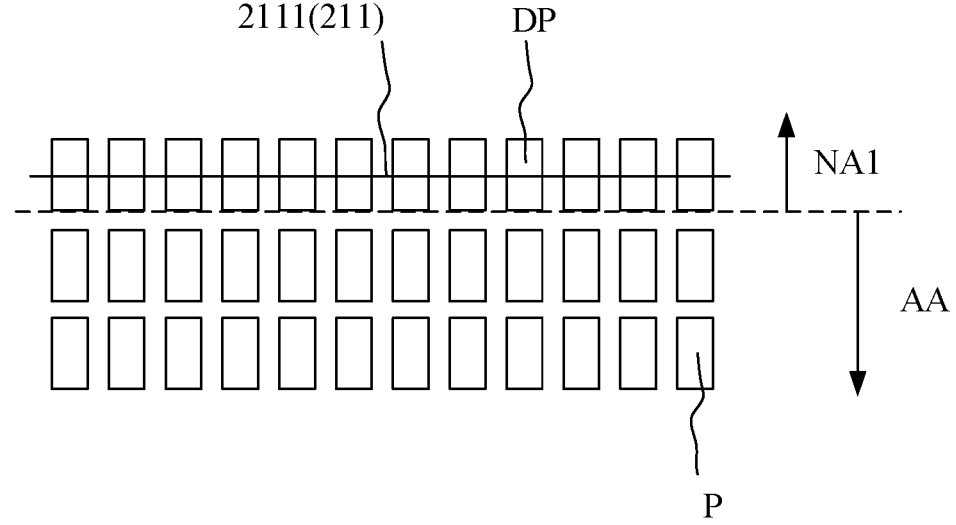
FIG. 11 is a partially enlarged view of a display panel according to some embodiments of the present disclosure.
Figure 12:
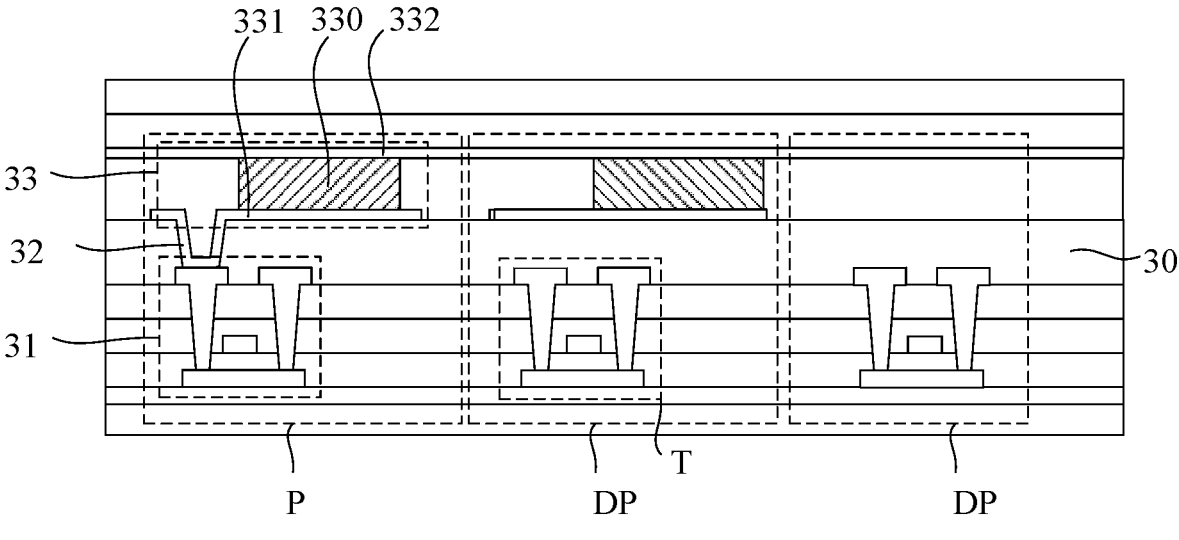
FIG. 12 is a cross-sectional view of a dummy pixel and a sub-pixel according to some embodiments of the present disclosure.

FIG. 10 is a schematic diagram of yet another display panel according to some embodiments of the present disclosure. FIG. 11 is a partially enlarged view of a display panel according to some embodiments of the present disclosure. FIG. 12 is a cross-sectional view of a dummy pixel and a sub-pixel according to some embodiments of the present disclosure. In some embodiments, as shown in FIG. 10, FIG. 11 and FIG. 12, the display panel includes a dummy pixel DP in the first non-display region NA1. The arrangement of the dummy pixel DP can ensure a density uniformity of the circuit pattern in the display panel, thereby optimizing the etching effect.

Exemplarily, in a direction perpendicular to the plane of the display panel, one of the first connection sub-line 2111 and the second connection sub-line 2112 at least partially overlaps the dummy pixel DP. With such a configuration, it does not need to provide an additional space in the first non-display region NA1 for arranging the first A connection line 211, thereby being beneficial to reducing the width of the first non-display region NA1. FIG. 11 illustrates an example in which the first connection sub-line 2111 partially overlaps the dummy pixel DP.

In some exemplary embodiments of the present disclosure, the dummy pixel DP includes a dummy pixel driving circuit. The dummy pixel driving circuit and the pixel circuit in the display region AA may have a same structure. In some embodiments, the dummy pixel driving circuit may be formed by deleting some elements from the structure of the pixel circuit in the display region AA. As shown in FIG. 12, the sub-pixel P in the display region AA includes a pixel driving circuit 31, a connection electrode 32, and a light-emitting element 33. The light-emitting element 33 includes a first electrode 331, a light-emitting layer 330, and a second electrode 332 that are stacked in the thickness direction of the display panel. The pixel driving circuit 31 is electrically connected to the light-emitting element 33 through the connection electrode 32. Exemplarily, as shown in FIG. 12, an insulation layer 30 is provided between the pixel driving circuit 31 and the light-emitting element 33, and the insulation layer 30 includes a though-hole. The through-hole is filled by the connection electrode 32.

It should be noted that in embodiments of the present disclosure, two or more transistors are provided in the pixel driving circuit 31 according to the function that needs to be achieved by the pixel driving circuit 31. In FIG. 12, one transistor T in the pixel driving transistor 31 is shown for illustration.

In some exemplary embodiments of the present disclosure, as shown in FIG. 12, the dummy pixel DP does not include the above connection electrode 32. In some exemplary embodiments, at least one part of the first A connection line 211 is arranged in the same layer as the connection electrode 32 in the display region. In an alternative embodiment, during the formation of the dummy pixel DP, a step of forming the though-hole in the insulation layer 30 may be omitted, so as to avoid the connection of the dummy pixel driving circuit and the dummy light-emitting element.

In some exemplary embodiments of the present disclosure, as shown in FIG. 12, the dummy pixel DP does not include one or more layers of the light-emitting element. In this case, at least one part of the first A connection line 211 may be arranged in the same layer as the electrode of the light-emitting element 33. For example, the first A connection line 211 and the first electrode 331 of the light-emitting element 33 may be arranged in a same layer, so as to simplify the manufacturing process of the display panel.

In addition, if the light-emitting element in the dummy pixel DP includes the electrode, the light-emitting element in the dummy pixel DP may emit light due to a floating state of the electrode. In some embodiments, the light-emitting element in the dummy pixel DP does not include the electrode, and thus the above-mentioned issue is avoided, thereby improving the display effect of the display panel.

Figure 13:
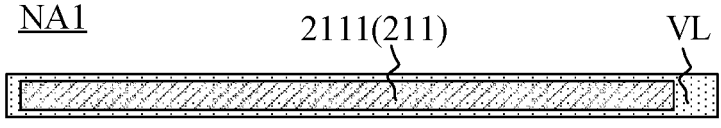
FIG. 13 is a partially enlarged view of a first non-display region of a display panel according to some embodiments of the present disclosure.

FIG. 13 is a partially enlarged view of a first non-display region of a display panel according to some embodiments of the present disclosure. In some embodiments of the present disclosure, the display panel includes a constant signal line VL located in the first non-display region NM. In the direction perpendicular to the plane of the display panel, one of the first connection sub-line 2111 and the second connection sub-line 2112 of the first A connection line 211 at least partially overlaps the constant signal line VL. This arrangement can reduce the width of the first non-display region NA1. Moreover, this arrangement can reduce the interference of other signal lines to the first A connection line 211, thereby being beneficial to ensuring the accuracy of the signal transmitted by the first A connection line 211.

In some exemplary embodiments of the present disclosure, as shown in FIG. 1, the second non-display region NA2 located between the first light-transmission sub-hole H11 and the second light-transmission sub-hole H12 includes a first region A1 and a second region A2. The density of the first-type connection line 21 in the first region A1 is greater than the density of the first-type connection line 21 in the second region A2, so that the light transmittance of the second region A2 is greater than the light transmittance of the first region A1. FIG. 1 illustrates an example in which no first-type connection line 21 is arranged in the second region A2. In some exemplary embodiments, the first region A1 is located at a side of the second region A2 close to the first light-transmission sub-hole H11 or the second light-transmission sub-hole H12. In some exemplary embodiments, the optical element may be arranged in the second region A2, so as to ensure the light sensing effect of the optical element, thereby enriching the functions of the display panel and improving the user experience.

In some exemplary embodiments of the present disclosure, the second non-display region NA2 between the first light-transmission sub-hole H11 and the second light-transmission sub-hole H12 may be provided with a dummy pixel, and the arrangement manner of the dummy pixel in the second non-display region NA2 may be same as the arrangement manner of the dummy pixel in the first non-display region NA1, which is not repeated herein. In the embodiments in which the second non-display region NA2 is provided with the dummy pixel, the first-type connection line 21 has at least one part that passes the second non-display region NA2 and overlaps the dummy pixels, so as to fully utilize the space of the second non-display region NA2.

Figure 14:
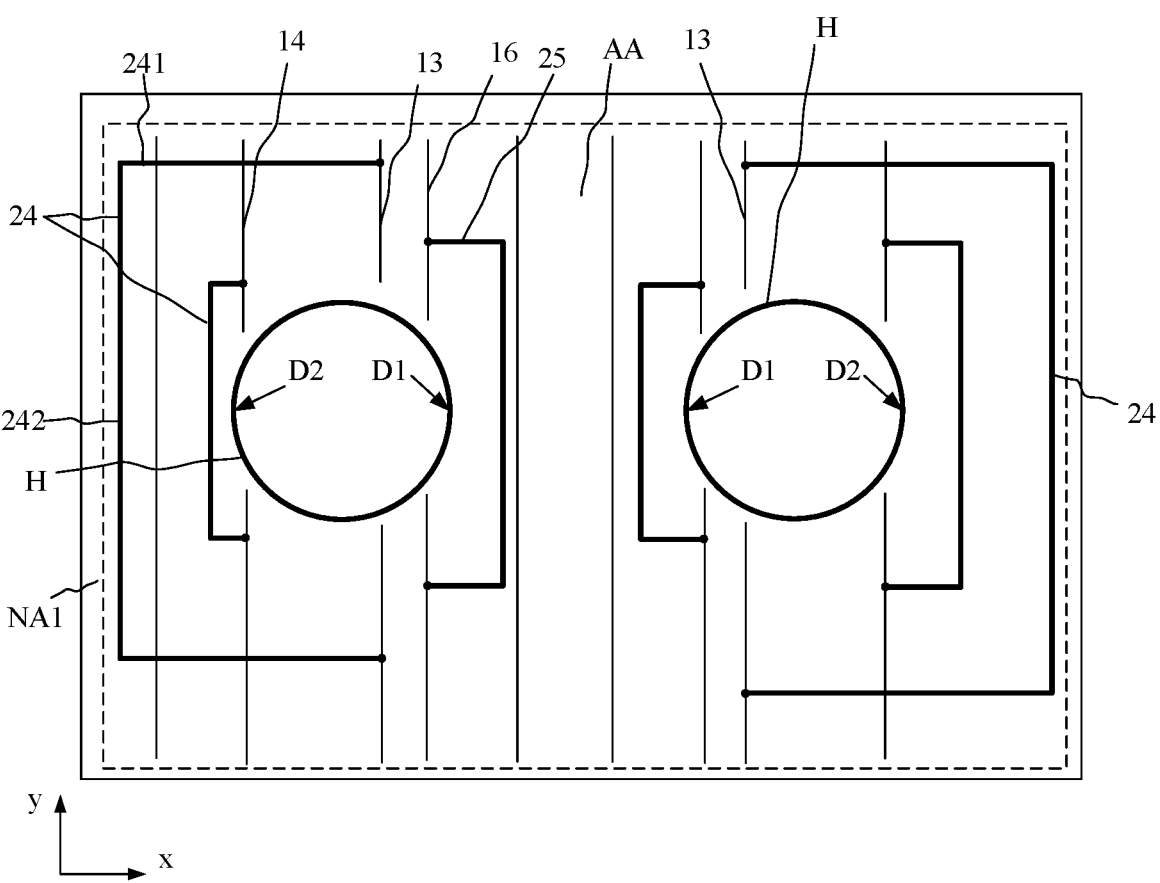
FIG. 14 is a schematic diagram of yet another display panel according to some embodiments of the present disclosure.

FIG. 14 is a schematic diagram of yet another display panel according to some embodiments of the present disclosure. In some exemplary embodiments of the present disclosure, the display panel further includes at least two light-transmission holes H, and the display region AA at least partially surrounds the at least two light-transmission holes H. The light-transmission hole H has a first end D1 and a second end D2 that are oppositely arranged along the first direction x. The first end D1 of the light-transmission hole H is located at a side of the second end of the light-transmission hole H away from the first non-display region NA1.

As shown in FIG. 14, the signal lines 1 further include a third signal line 13. For a same light-transmission hole H, a distance between the third signal line 13 and the first end D1 of the light-transmission hole H is smaller than a distance between the third signal line 13 and the second end D2 of the light-transmission hole H. In some embodiments of the present disclosure, two segments of the third signal line 13 that are located at two sides of the light-transmission hole H are electrically connected to each other through a fourth-type connection line 24. The fourth-type connection line 24 has at least one part located in the display region AA, and the fourth-type connection line 24 is located between the light-transmission hole H and the first non-display region NA1. In other words, at least two light-transmission holes H are located at a same side of the fourth-type connection line 24. Compared with an arrangement in which the fourth-type connection line 24 is located between two adjacent light-transmission holes H, such an arrangement can reduce the number of connection lines arranged between two adjacent light-transmission holes H; moreover, such an arrangement can avoid that a distance between the connection lines between two adjacent light-transmission holes H is too small, thereby being compatible with the current process capabilities.

In some exemplary embodiments of the present disclosure, multiple sub-pixels may be arranged between two light-transmission holes H. That is, the region between two light-transmission holes H belongs to the display region AA. With the above-mentioned arrangement provided by the embodiments of the present disclosure, the number of the connection lines in the display region AA between two light-transmission holes H can be reduced, the light transmittance of the display region AA between two light-transmission holes H is ensured, and the signal interference between the connection line and other signal line that is located in the display region AA between two light-transmission holes H is reduced.

In some exemplary embodiments of the present disclosure, as shown in FIG. 14, the signal lines 1 further include a fourth signal line 14. For a same light-transmission hole H, a distance between the fourth signal line 14 and the first end D1 of the light-transmission hole H is greater than a distance between the fourth signal line 14 and the second end D2 of the light-transmission hole H.

In some exemplary embodiments of the present disclosure, the display panel may include multiple fourth-type connection lines 24 that are located between the light-transmission hole H and the first non-display region NA1. In some embodiments of the present disclosure, as shown in FIG. 14, for one or more fourth signal lines 14 that are disconnected by the light-transmission hole H, two segments of the fourth signal line 14 that are located at two sides of the light-transmission hole H are electrically connected to each other by the fourth-type connection line 24.

In some exemplary embodiments of the present disclosure, as shown in FIG. 14, the fourth-type connection line 24 that is electrically connected to the fourth signal line 14 is located between the light-transmission hole H and the fourth-type connection line 24 that is electrically connected to the third signal line 13. In some exemplary embodiments of the present disclosure, the fourth-type connection line 24 that is electrically connected to the fourth signal line 14 and the fourth-type connection line 24 that is electrically connected to the third signal line 13 may be arranged in a same layer. With such a configuration, intersecting of the fourth-type connection lines 24 that are connected to different signal lines 1 is avoided, which can simplify the manufacturing process of the display panel and ensure a well insulation of different fourth-type connection lines 24.

Figure 15:
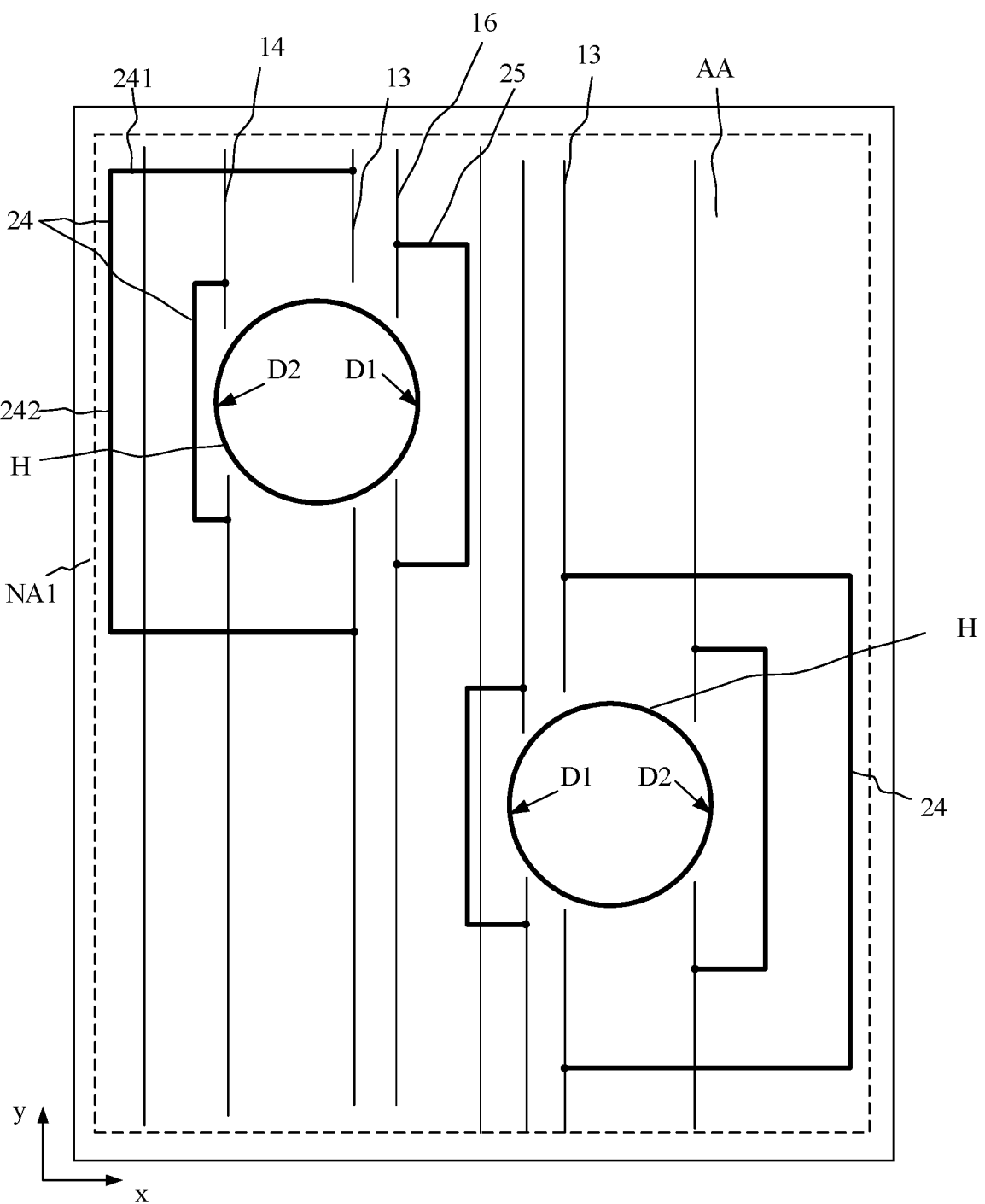
FIG. 15 is a schematic diagram of yet another display panel according to some embodiments of the present disclosure.

FIG. 15 is a schematic diagram of yet another display panel according to some embodiments of the present disclosure. In some exemplary embodiments of the present disclosure, as shown in FIG. 15, the arranging direction of the two adjacent light-transmission holes H may intersect both the first direction x and the second direction y, so as to improve the arrangement flexibility of the light-transmission holes H.

Figure 16:
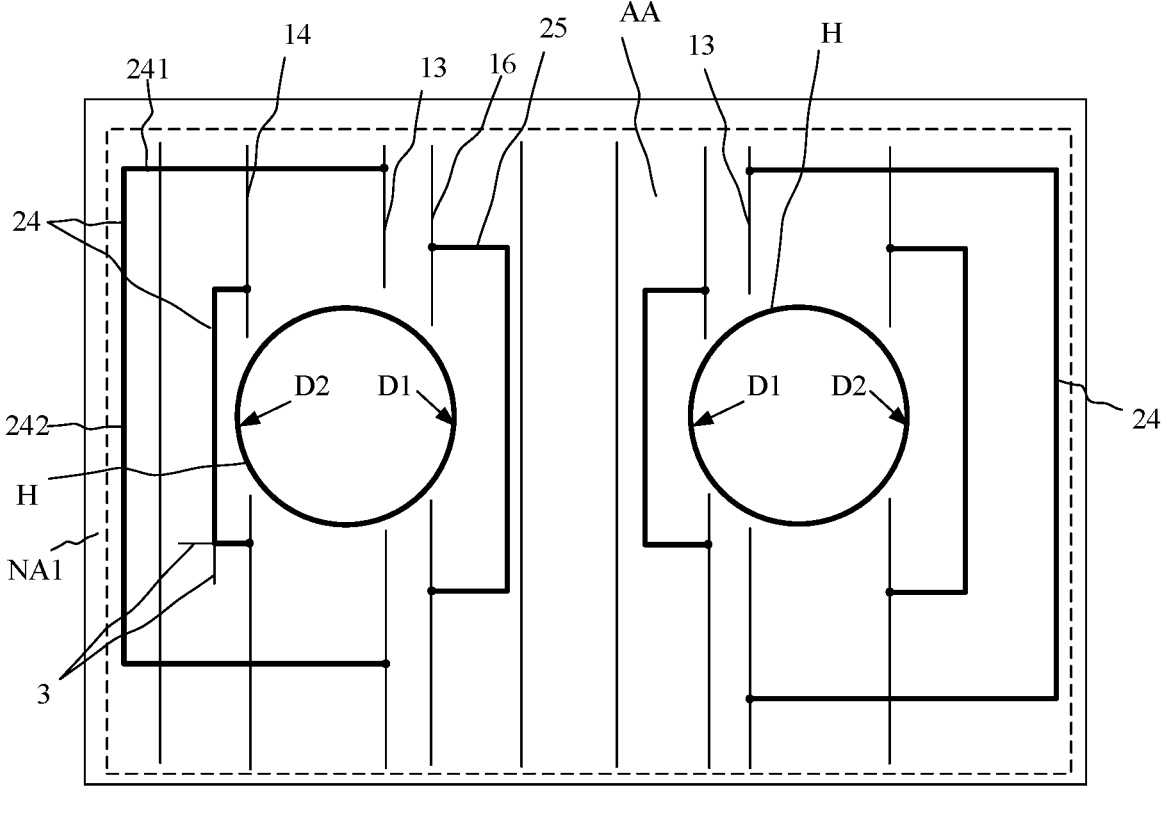
FIG. 16 is a schematic diagram of yet another display panel according to some embodiments of the present disclosure.

FIG. 16 is a schematic diagram of yet another display panel according to some embodiments of the present disclosure. In some exemplary embodiments of the present disclosure, as shown in FIG. 16, the display panel further includes a compensation line 3, and at least one of the fourth-type connection lines 24 is electrically connected to the compensation line 3. The compensation line 3 can improve the load uniformity of the signal lines that are electrically connected to different fourth-type connection lines 24 and have different lengths, thereby improving the display uniformity of the display panel.

In some exemplary embodiments of the present disclosure, as shown in FIG. 16, the fourth-type connection line 24 includes a first connection sub-line 241 and a second connection sub-line 242 that have different extending directions. The compensation line 3 extends from an intersection of the first connection sub-line 241 and the second connection sub-line 242 along a direction away from the first connection sub-line 241 or the second connection sub-line 242. In the exemplary example illustrated in FIG. 16, two compensation lines 3 are provided, one of the two compensation lines 3 is parallel to the first connection sub-line 241, and the other one of the two compensation lines 3 is parallel to the second connection sub-line 242.

In some exemplary embodiments of the present disclosure, the compensation line 3 may be arranged in the same layer as the first connection sub-line 241 or the second connection sub-line 242, so as to simplify the manufacturing process of the display panel. In some embodiments of the present disclosure, in addition to improving the load uniformity of different signal lines, the compensation line 3 can also improve the light reflectivity uniformity between a position provided with the fourth-type connection line 24 and a position not provided with the fourth-type connection line 24 in the display panel, thereby being beneficial to improving the display effect of the display panel.

In some exemplary embodiments of the present disclosure, a cross-sectional area of the fourth-type connection line 24 that is electrically connected to the third signal line 13 is different from a cross-sectional area of the fourth-type connection line 24 that is electrically connected to the fourth signal line 14, so as to improve the load uniformity of the signal lines 1 that are electrically connected to different fourth-type connection lines 24 and have different lengths.

In some exemplary embodiments of the present disclosure, different fourth-type connection lines 24 have different electrical conductivities, so as to improve the load uniformity of the signal lines 1 that are electrically connected to different fourth-type connection lines 24 and have different lengths.

In some exemplary embodiments of the present disclosure, both the cross-sectional areas and the electrical conductivities of different fourth-type connection lines 24 may be adjusted, so as to improve the load uniformity of the signal lines 1 that are electrically connected to different fourth-type connection lines 24 and have different lengths.

Figure 17:
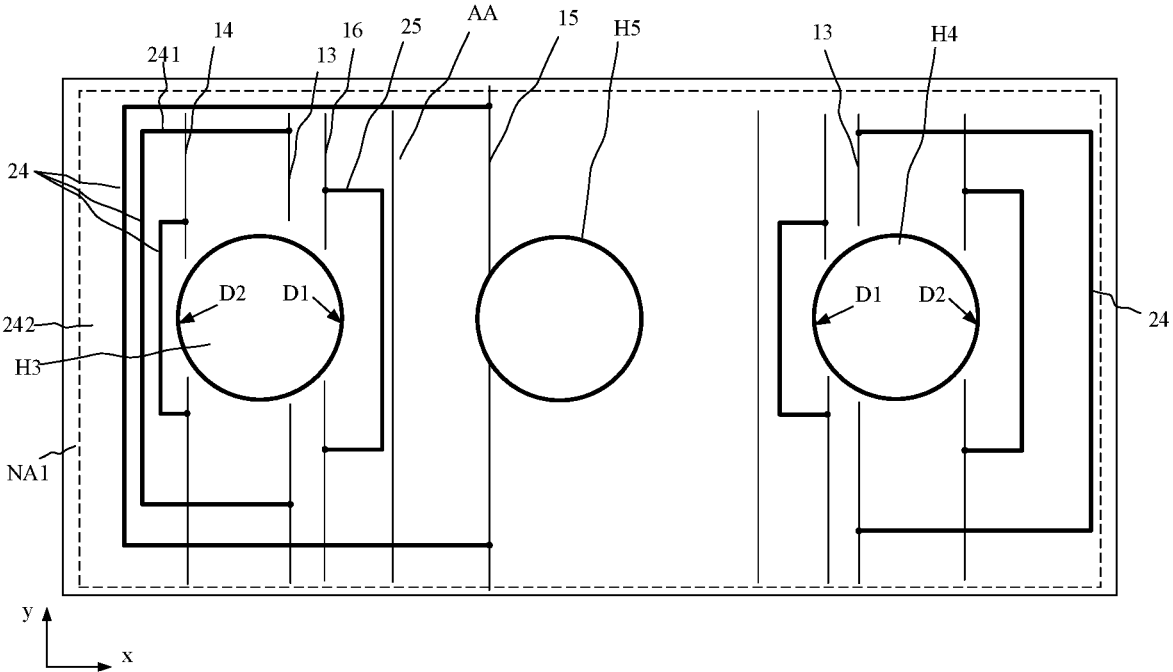
FIG. 17 is a schematic diagram of yet another display panel according to some embodiments of the present disclosure.

FIG. 17 is a schematic diagram of yet another display panel according to some embodiments of the present disclosure. In some exemplary embodiments of the present disclosure, as shown in FIG. 17, at least two light-transmission holes H include a third light-transmission hole H3, a fourth light-transmission hole H4, and a fifth light-transmission hole H5. The fifth light-transmission hole H5 is located between the third light-transmission hole H3 and the fourth light-transmission hole H4.

The signal lines 1 further include a fifth signal line 15. Along the second direction y, the fifth signal line 15 has two segments located at two sides of the fifth light-transmission hole H5. A distance between the fifth signal line 15 and the second end of the third light-transmission hole H3 is smaller than a distance between the fifth signal line 15 and the second end of fourth light-transmission hole H4.

In some embodiments of the present disclosure, at least one of the fourth-type connection lines 24 is electrically connected to the fifth signal line 15. Such an arrangement can reduce the number of connection lines between the third light-transmission hole H3 and the fifth light-transmission hole H5. If the region between the third light-transmission hole H3 and the fifth light-transmission hole H5 is provided with sub-pixels and functions as the display region AA, the above-mentioned arrangement can reduce the number of connection lines between the third light-transmission hole H3 and the fifth light-transmission hole H5 compared with the arrangement that the fourth-type connection line electrically connected to the fifth signal line 15 is arranged between the third light-transmission hole H3 and the fifth light-transmission hole H5. Moreover, the above-mentioned arrangement can avoid that the distance between the connection lines between two adjacent light-transmission holes H is too small, thereby being compatible with the current process capabilities. In addition, the above-mentioned arrangement can ensure the light transmittance of the display region AA between the third light-transmission hole H3 and the fifth light-transmission hole H5, and reduce the signal interference between the connection line and other signal line located in the display region AA between the third light-transmission hole H3 and the fifth light-transmission hole H5.

In some exemplary embodiments of the present disclosure, as shown in FIG. 17, the fourth-type connection line 24 that is electrically connected to the fifth signal line 15 is located at a side of the fourth-type connection line 24 that is electrically connected to the third signal line 13 away from the third light-transmission hole H3. With such a configuration, the fourth-type connection line 24 that is electrically connected to the fifth signal line 15 and the fourth-type connection line 24 that is electrically connected to the third signal line 13 may be arranged in a same layer, and do not intersect each other, thereby simplifying the manufacturing process of the display panel while ensuring the well insulation of the two fourth-type connection lines 24.

In some exemplary embodiments of the present disclosure, as shown in FIG. 14, FIG. 15, FIG. 16 and FIG. 17, the display panel further includes a sixth signal line 16 located in the display region AA. The sixth signal line 16 is closer to the first end D1 of one light-transmission hole H than the second end D2 of the same light-transmission hole H. Two segments of the sixth signal line 16 that are located at two sides of the light-transmission hole H are electrically connected to each other through a fifth-type connection line 25. The fifth-type connection line 25 has at least one part located in the display region AA. In some exemplary embodiments of the present disclosure, as shown in FIG. 14, FIG. 15, FIG. 16 and FIG. 17, the fifth-type connection line 25 has at least one part located between two adjacent light-transmission holes H. With such a configuration, the length of the fifth-type connection line 25 can be set short, which is beneficial to reducing the load.

In some exemplary embodiments of the present disclosure, as shown in FIG. 14, FIG. 15, FIG. 16 and FIG. 17, along the second direction y, a virtual extension line of the third signal line 13 and a virtual extension line of the sixth signal line 16 pass a same light-transmission hole H, and the third signal line 13 is located at a side of the sixth signal line 16 close to the second end D2 of this light-transmission hole H. That is, when the space between two light-transmission holes H is limited, this space is preferable to arrange the connection line that is electrically connected to the signal line close to this space, so as to avoid a long connection line, which is beneficial to reducing the load.

Figure 18:
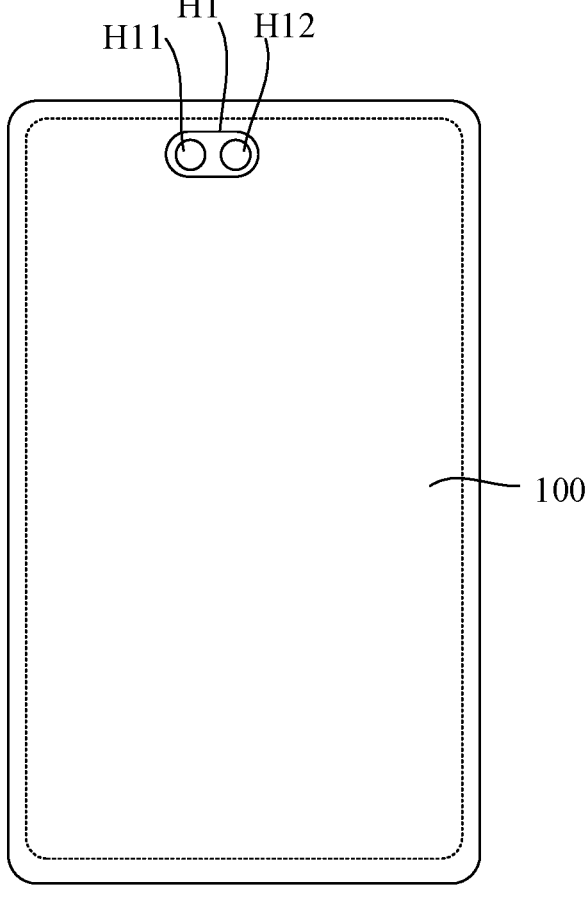
FIG. 18 is a schematic diagram of a display device according to some embodiments of the present disclosure.

Embodiments of the present disclosure further provide a display device. FIG. 18 is a schematic diagram of a display device according to some embodiments of the present disclosure. As shown in FIG. 18, the display device includes the display panel 100 described above. A specific structure of the display panel 100 has been explained in the above embodiments and will not be repeatedly described herein. Of course, the display device shown in FIG. 20 is only a schematic illustration, and the display device can be any electronic device with a display function, such as a mobile phone, a tablet computer, a notebook computer, an electronic paper reader, a television or the like.

The above embodiments are merely some embodiments of the present disclosure and are not intended to limit the present disclosure. Any modifications, equivalent substitutions, and improvements made within the principle of the present disclosure shall fall into the scope of the present disclosure.

The invention claimed is:

1. A display panel, comprising:
a display region;
a first non-display region at least partially surrounding the display region;
a first light-transmission hole, the first light-transmission hole comprising a first light-transmission sub-hole and a second light-transmission sub-hole arranged along a first direction, wherein display region at least partially surrounds the first light-transmission hole;

a second non-display region located between the first light-transmission sub-hole and the second light-transmission sub-hole;
signal lines arranged in the display region along the first direction, wherein each signal line of the signal lines extends along a second direction; and
connection lines, each of the connection lines electrically connecting two segments of a respective one of the signal lines located at two sides of the first light-transmission hole,
wherein the connection lines comprise first-type connection lines and second-type connection lines, wherein each of the first-type connection lines has at least one part located between the first light-transmission sub-hole and the second light-transmission sub-hole, wherein each of the second-type connection lines has at least one part located between the first light-transmission sub-hole and the first non-display region; and
wherein a distance between two adjacent first-type connection lines of the first-type connection lines is smaller than a distance between two adjacent second-type connection lines of the second-type connection lines,
wherein the display panel further comprises a third non-display region and a fourth non-display region,
wherein the first-type connection lines comprise at least two first A connection lines, and each first A connection line of the at least two first A connection lines has at least one part located in the display region;
wherein the display region at least partially surrounds the third non-display region and the fourth non-display region, the third non-display region at least partially surrounds the first light-transmission sub-hole, and the fourth non-display region at least partially surrounds the second light-transmission sub-hole;
wherein the first-type connection lines further comprise at least two first B connection lines, and each first B connection line of the at least two first B connection lines is located in the third non-display region or the fourth non-display region; and
wherein a distance between two adjacent first A connection lines of the at least two first A connection lines is greater than or equal to a distance between two adjacent first B connection lines of the at least two first B connection lines.

2. The display panel according to claim 1, wherein the first-type connection lines comprise at least one first A connection line, and each first A connection line of the at least one first A connection line has at least one part located in the display region.

3. The display panel according to claim 1, further comprising a third non-display region and a fourth non-display region,
wherein the display region at least partially surrounds the third non-display region and the fourth non-display region, the third non-display region at least partially surrounds the first light-transmission sub-hole, and the fourth non-display region at least partially surrounds the second light-transmission sub-hole; and
wherein the first-type connection lines comprise at least one first B connection line, and the each first B connection line of at least one first B connection line is located in the third non-display region or the fourth non-display region.

4. The display panel according to claim 1, wherein the second-type connection lines comprise at least one second A connection line, and each second A connection line of the at least one second A connection line has at least one part located in the display region.

5. The display panel according to claim 1, further comprising a third non-display region, wherein the display region at least partially surrounds the third non-display region, and the third non-display region at least partially surrounds the first light-transmission sub-hole; and wherein the second-type connection lines comprise at least one second B connection line, and each second B connection line of the at least one second B connection line is located in the third non-display region.

6. The display panel according to claim 1, wherein a number of the first-type connection lines is less than a number of the second-type connection lines.

7. The display panel according to claim 1, further comprising a third non-display region and a fourth non-display region, wherein the first-type connection lines comprise at least two first A connection lines, and each first A connection line of the at least two first A connection lines has at least one part located in the display region;

wherein the display region at least partially surrounds the third non-display region and the fourth non-display region, the third non-display region at least partially surrounds the first light-transmission sub-hole, and the fourth non-display region at least partially surrounds the second light-transmission sub-hole;

wherein the first-type connection lines further comprise at least two first B connection lines, and each first B connection line of the at least two first B connection lines is located in the third non-display region or the fourth non-display region; and wherein a distance between two adjacent first A connection lines of the at least two first A connection lines is greater than or equal to a distance between two adjacent first B connection lines of the at least two first B connection lines.

8. The display panel according to claim 1, further comprising a third non-display region and a fourth non-display region, wherein the display region at least partially surrounds the third non-display region and the fourth non-display region, the third non-display region at least partially surrounds the first light-transmission sub-hole, and the fourth non-display region at least partially surrounds the second light-transmission sub-hole, wherein the first-type connection lines further comprise at least two first B connection lines, and each first B connection line of the at least two first B connection lines is located in the third non-display region or the fourth non-display region; and wherein two adjacent first B connection lines of the at least two first B connection lines are located in different layers.

9. The display panel according to claim 1, wherein the display region has a symmetry axis extending along the second direction, and the symmetry axis passes the first light-transmission hole.

10. The display panel according to claim 1, wherein along the first direction, a distance between the first light-transmission sub-hole and the second light-transmission sub-hole is not equal to a distance between the first light-transmission sub-hole and the first non-display region.

11. The display panel according to claim 1, further comprising a second light-transmission hole, wherein along the first direction, the second light-transmission hole is located at a side of the second light-transmission sub-hole away from the first light-transmission sub-hole.

12. The display panel according to claim 11, wherein a distance between the first light-transmission sub-hole and the second light-transmission sub-hole is greater than a distance between the second light-transmission sub-hole and the second light-transmission hole.

13. The display panel according to claim 11, further comprising: a third-type connection line, wherein the third-type connection line has at least one part located between the first light-transmission hole and the second light-transmission hole, and wherein the third-type connection line electrically connects two segments of one of the signal lines located at the two sides of the first light-transmission hole, and/or the third-type connection line electrically connects two segments of one of the signal lines located at two sides of the second light-transmission hole.

14. The display panel according to claim 13, wherein the third-type connection line comprises at least one third A connection line, and each third A connection line of the at least one third A connection line has at least one part located in the display region.

15. The display panel according to claim 13, further comprising a fifth non-display region, wherein the display region at least partially surrounds the fifth non-display region, and wherein the fifth non-display region at least partially surrounds the second light-transmission hole; and wherein the third-type connection line comprises at least one third B connection line, and the at least one third B connection line is located in the fifth non-display region.

16. The display panel according to claim 2, wherein each first A connection line of the at least one first A connection line comprises a first connection sub-line and a second connection sub-line, and wherein an extending direction of the first connection sub-line intersects an extending direction of the second connection sub-line.

17. The display panel according to claim 16, wherein either the first connection sub-line or the second connection sub-line is located in the first non-display region.

18. The display panel according to claim 16, further comprising a dummy pixel located in the first non-display region, wherein in a direction perpendicular to a plane of the display panel, either the first connection sub-line or the second connection sub-line at least partially overlaps the dummy pixel.

19. The display panel according to claim 18, further comprising a sub-pixel located in the display region, wherein the sub-pixel comprises a pixel driving circuit, a connection electrode, and a light-emitting element, wherein the pixel driving circuit is electrically connected to the light-emitting element through the connection electrode;

wherein the dummy pixel does not comprise any connection electrode; and wherein the connection electrode is arranged in a same layer as either the first connection sub-line or the second connection sub-line.

20. The display panel according to claim 18, further comprising a sub-pixel located in the display region, wherein the sub-pixel comprises a pixel driving circuit, a connection electrode, and a light-emitting element, wherein pixel driving circuit is electrically connected to the light-emitting element through the connection electrode;

wherein the dummy pixel does not comprise any light-emitting element; and wherein the light-emitting element in the sub-pixel is arranged in a same layer as either the first connection sub-line or the second connection sub-line.

21. The display panel according to claim 16, further comprising a constant signal line located in the first non-display region, wherein in a direction perpendicular to a plane of the display panel, either the first connection sub-line or the second connection sub-line at least partially overlaps the constant signal line.

22. The display panel according to claim 1, further comprising at least two light-transmission holes, wherein the display region at least partially surrounds the at least two light-transmission holes, wherein each light transmission hole of the at least two light-transmission holes has a first end and a second end that are oppositely arranged along the first direction, the first end of each light-transmission hole being located at a side of the second end of each light-transmission hole away from the first non-display region;

wherein the signal lines comprise a third signal line, wherein a distance between the third signal line and the first end of each light-transmission hole is smaller than a distance between the third signal line and the second end of each light-transmission hole; and wherein the display panel further comprises fourth-type connection lines, each fourth-type connection line of the fourth-type connection lines having at least one part located in the display region, wherein the fourth-type connection lines are located between the light-transmission hole and the first non-display region, and at least one fourth-type connection line of the fourth-type connection lines electrically connects two segments of the third signal line that are located along the second direction at two sides of each light-transmission hole.

23. The display panel according to claim 22, wherein the signal lines further comprise a fourth signal line, wherein a distance between the fourth signal line and the first end of each light-transmission hole is greater than a distance between the fourth signal line and the second end of each light-transmission hole; and wherein at least one of the fourth-type connection lines electrically connects two segments of the fourth signal line that are located along the second direction at two sides of each light-transmission hole.

24. The display panel according to claim 23, wherein the fourth-type connection line that is electrically connected to the fourth signal line is located between each light-transmission hole and the fourth-type connection line that is electrically connected to the third signal line.

25. The display panel according to claim 22, further comprising a compensation line, wherein at least one of the fourth-type connection lines is electrically connected to the compensation line.

26. The display panel according to claim 25, wherein each fourth-type connection line of the fourth-type connection lines comprises a first connection sub-line and a second connection sub-line, wherein an extending direction of the first connection sub-line is different from an extending direction of the second connection sub-line, and the compensation line extends from an intersection of the first connection sub-line and the second connection sub-line along a direction away from the first connection sub-line or the second connection sub-line.

27. The display panel according to claim 26, wherein the compensation line is arranged in a same layer as the first connection sub-line or the second connection sub-line.

28. The display panel according to claim 23, wherein a cross-sectional area of the fourth-type connection line that is electrically connected to the fourth signal line is different from a cross-sectional area of the fourth-type connection line that is electrically connected to the third signal line.

29. The display panel according to claim 23, wherein an electrical conductivity of the fourth-type connection line that is electrically connected to the fourth signal line is different from an electrical conductivity of the fourth-type connection line that is electrically connected to the third signal line.

30. The display panel according to claim 22, wherein the at least two light-transmission holes comprise a third light-transmission hole, a fourth light-transmission hole, and a fifth light-transmission hole located between the third light-transmission hole and the fourth light-transmission hole, wherein the signal lines further comprise a fifth signal line, and wherein the fifth signal line comprises two segments located at two sides of the fifth light-transmission hole along the second direction;

wherein a distance between the fifth signal line and a second end of the third light-transmission hole is smaller than a distance between the fifth signal line and a second end of the fourth light-transmission hole; and wherein at least one fourth-type connection line of the fourth-type connection lines electrically connects the two segments of the fifth signal line.

31. The display panel according to claim 30, wherein the at least one fourth-type connection electrically connected to the fifth signal line is located at a side of the fourth-type connection line that is electrically connected to the third signal line away from the third light-transmission hole.

32. The display panel according to claim 22, wherein the signal lines further comprise a sixth signal line located in the display region, and wherein a distance between the sixth signal line and the first end of each light-transmission hole is smaller than a distance between the sixth signal line and the second end of each light-transmission hole; and wherein the connection lines further comprise a fifth-type connection line, the fifth-type connection line electrically connecting two segments of the sixth signal line that are located at two sides of each light-transmission hole along the second direction, and the fifth-type connection line having at least one part located between two adjacent light-transmission holes of the at least two light-transmission holes.

33. The display panel according to claim 32, wherein along the second direction, an extension line of the third signal line and an extension line of the sixth signal line pass a same light-transmission hole of the at least two light-transmission holes, and the third signal line is located at a side of the sixth signal line close to the second end of the same light-transmission hole.

34. A display device, comprising a display panel, comprising:

a display region;

a first non-display region at least partially surrounding the display region;

a first light-transmission hole, the first light-transmission hole comprising a first light-transmission sub-hole and a second light-transmission sub-hole arranged along a first direction, wherein the display region at least partially surrounding the first light-transmission hole;

a second non-display region located between the first light-transmission sub-hole and the second light-transmission sub-hole;

signal lines arranged in the display region, the signal lines being arranged along the first direction and each extending along a second direction; and connection lines, each connection line of the connection lines electrically connecting two segments of a respective one of the signal lines located at two sides of the first light-transmission hole, wherein the connection lines comprise first-type connection lines and second-type connection lines, each first-type connection line of the first-type connection lines having at least one part located between the first light-transmission sub-hole and the second light-transmission sub-hole, and each second-type connection line of the second-type connection lines having at least one part located between the first light-transmission sub-hole and the first non-display region; and wherein a distance between two adjacent first-type connection lines of the first-type connection lines is smaller than a distance between two adjacent second-type connection lines of the second-type connection lines, wherein the display panel further comprises a third non-display region and a fourth non-display region, wherein the first-type connection lines comprise at least two first A connection lines, and each first A connection line of the at least two first A connection lines has at least one part located in the display region;

wherein the display region at least partially surrounds the third non-display region and the fourth non-display region, the third non-display region at least partially surrounds the first light-transmission sub-hole, and the fourth non-display region at least partially surrounds the second light-transmission sub-hole;

wherein the first-type connection lines further comprise at least two first B connection lines, and each first B connection line of the at least two first B connection lines is located in the third non-display region or the fourth non-display region; and wherein a distance between two adjacent first A connection lines of the at least two first A connection lines is greater than or equal to a distance between two adjacent first B connection lines of the at least two first B connection lines.

35. A display panel, comprising:

a display region;

a first non-display region at least partially surrounding the display region;

a first light-transmission hole, the first light-transmission hole comprising a first light-transmission sub-hole and a second light-transmission sub-hole arranged along a first direction, wherein display region at least partially surrounds the first light-transmission hole;

a second non-display region located between the first light-transmission sub-hole and the second light-transmission sub-hole;

signal lines arranged in the display region along the first direction, wherein each signal line of the signal lines extends along a second direction; and connection lines, each of the connection lines electrically connecting two segments of a respective one of the signal lines located at two sides of the first light-transmission hole, wherein the connection lines comprise first-type connection lines and second-type connection lines, wherein each of the first-type connection lines has at least one part located between the first light-transmission sub-hole and the second light-transmission sub-hole, wherein each of the second-type connection lines has at least one part located between the first light-transmission sub-hole and the first non-display region; and wherein a distance between two adjacent first-type connection lines of the first-type connection lines is smaller than a distance between two adjacent second-type connection lines of the second-type connection lines, wherein the display panel further comprises a third non-display region and a fourth non-display region, wherein the display region at least partially surrounds the third non-display region and the fourth non-display region, the third non-display region at least partially surrounds the first light-transmission sub-hole, and the fourth non-display region at least partially surrounds the second light-transmission sub-hole, wherein the first-type connection lines further comprise at least two first B connection lines, and each first B connection line of the at least two first B connection lines is located in the third non-display region or the fourth non-display region; and wherein two adjacent first B connection lines of the at least two first B connection lines are located in different layers.

\* \* \* \* \*